(12) United States Patent
Piepgras et al.

(10) Patent No.: US 7,543,956 B2
(45) Date of Patent: Jun. 9, 2009

(54) CONFIGURATIONS AND METHODS FOR EMBEDDING ELECTRONICS OR LIGHT EMITTERS IN MANUFACTURED MATERIALS

(75) Inventors: Colin Piepgras, Swampscott, MA (US); Kevin J. Dowling, Westford, MA (US)

(73) Assignee: Philips Solid-State Lighting Solutions, Inc., Burlington, MA (US)

( * ) Notice: Subject to any disclaimer, the term of this patent is extended or adjusted under 35 U.S.C. 154(b) by 530 days.

(21) Appl. No.: 11/364,304

(22) Filed: Feb. 28, 2006

(65) Prior Publication Data

US 2006/0198128 A1 Sep. 7, 2006

Related U.S. Application Data

(60) Provisional application No. 60/657,205, filed on Feb. 28, 2005.

(51) Int. Cl.
*F21S 19/00* (2006.01)
*F21S 2/00* (2006.01)

(52) U.S. Cl. .................. 362/257; 362/311; 362/253; 362/800

(58) Field of Classification Search ................. 362/145, 362/147, 153, 253, 257, 311, 800
See application file for complete search history.

(56) References Cited

U.S. PATENT DOCUMENTS

| | | |
|---|---|---|
| 3,595,991 A | 7/1971 | Diller |
| 3,696,393 A | 10/1972 | McDonald |
| 3,740,570 A | 6/1973 | Kaelin et al. |
| 3,787,752 A | 1/1974 | Delay |
| 3,942,065 A | 3/1976 | Russ |
| 4,151,547 A | 4/1979 | Rhoades et al. |
| 4,267,559 A | 5/1981 | Johnson et al. |
| 4,360,804 A | 11/1982 | Okura |
| 4,394,600 A | 7/1983 | Flannagan |

(Continued)

FOREIGN PATENT DOCUMENTS

EP 0390479 A2 3/1990

(Continued)

OTHER PUBLICATIONS

International Search Report issued by USPTO on Jul. 28, 2008 in a counterpart international application No. PCT/US06/06888.

(Continued)

*Primary Examiner*—Evan Pert

(57) ABSTRACT

Methods and means for embedding electronic components, such as LED-based light sources and associated control circuitry, into molded or continuously cast surface materials (e.g., material manufactured under the trademark CORIAN®). During the manufacture of the surface material, the components can be held in position using a scaffold or frame constructed of a sacrificial material, the same material as the finished surface material and/or another material used in the manufacture of the finished product. The embedded components can include control circuitry, e.g., printed circuit boards, for separately controlling each component, power conductors and data busses. Conductors and/or busses can be in the form of conductive rails, wire mesh or sheets. Access to the conductors in the finished product can be made by a number of methods, including but not limited to sanding, grinding, drilling into, screwing into, and/or inserting pins into the finished material.

44 Claims, 10 Drawing Sheets

U.S. PATENT DOCUMENTS

| | | |
|---|---|---|
| 4,470,044 A | 9/1984 | Bell |
| 4,559,480 A | 12/1985 | Nobs |
| 4,581,612 A | 4/1986 | Jones |
| 4,581,655 A | 4/1986 | Ide et al. |
| 4,612,720 A | 9/1986 | Manners-Smith et al. |
| 4,644,342 A | 2/1987 | Abbas |
| 4,654,754 A | 3/1987 | Daszkowski |
| 4,720,709 A | 1/1988 | Imanura et al. |
| 4,729,076 A | 3/1988 | Masami et al. |
| 4,782,336 A | 11/1988 | Bailey |
| 4,833,542 A | 5/1989 | Hara et al. |
| 4,857,801 A | 8/1989 | Farrell |
| 4,929,866 A | 5/1990 | Murata et al. |
| 4,935,665 A | 6/1990 | Murata |
| 4,974,119 A | 11/1990 | Martin |
| 5,061,874 A | 10/1991 | Hecq et al. |
| 5,136,483 A | 8/1992 | Schoniger et al. |
| 5,173,839 A | 12/1992 | Metz, Jr. |
| 5,230,175 A | 7/1993 | Follis |
| 5,235,347 A | 8/1993 | Lee |
| 5,262,658 A | 11/1993 | Jankowski |
| 5,375,043 A | 12/1994 | Tokunaga |
| 5,410,328 A | 4/1995 | Yoksza et al. |
| 5,528,474 A | 6/1996 | Roney et al. |
| 5,583,349 A | 12/1996 | Norman et al. |
| 5,583,350 A | 12/1996 | Norman et al. |
| 5,634,711 A | 6/1997 | Kennedy et al. |
| 5,684,309 A | 11/1997 | McIntosh et al. |
| 5,782,555 A | 7/1998 | Hochstein |
| 5,796,376 A | 8/1998 | Banks |
| 5,808,592 A | 9/1998 | Mizutani et al. |
| 5,857,767 A | 1/1999 | Hochstein |
| 5,900,850 A | 5/1999 | Bailey et al. |
| 5,931,577 A | 8/1999 | Ishibashi |
| 5,949,581 A | 9/1999 | Kurtenbach et al. |
| 5,961,201 A | 10/1999 | Gismondi |
| 6,016,038 A | 1/2000 | Mueller et al. |
| 6,023,255 A | 2/2000 | Bell |
| 6,028,582 A | 2/2000 | Drew et al. |
| 6,069,595 A | 5/2000 | Tokimoto |
| 6,069,597 A | 5/2000 | Hansen |
| 6,104,414 A | 8/2000 | Odryna et al. |
| 6,150,774 A | 11/2000 | Mueller et al. |
| 6,166,496 A | 12/2000 | Lys et al. |
| 6,175,342 B1 | 1/2001 | Nicholson et al. |
| 6,211,626 B1 | 4/2001 | Lys et al. |
| 6,237,290 B1 | 5/2001 | Tokimoto et al. |
| 6,292,901 B1 | 9/2001 | Lys et al. |
| 6,314,669 B1 | 11/2001 | Tucker |
| 6,329,764 B1 | 12/2001 | Van de Ven |
| 6,330,111 B1 | 12/2001 | Myers |
| 6,331,915 B1 | 12/2001 | Myers |
| 6,340,868 B1 | 1/2002 | Lys et al. |
| 6,361,198 B1 | 3/2002 | Reed |
| 6,379,209 B1 | 4/2002 | Tucker |
| 6,386,720 B1 | 5/2002 | Mochizuki |
| 6,404,131 B1 | 6/2002 | Kawano et al. |
| 6,459,919 B1 | 10/2002 | Lys et al. |
| 6,476,779 B1 | 11/2002 | Yano et al. |
| 6,498,355 B1 | 12/2002 | Harrah et al. |
| 6,498,592 B1 | 12/2002 | Matthies |
| 6,509,906 B1 | 1/2003 | Awe et al. |
| 6,528,954 B1 | 3/2003 | Lys et al. |
| 6,540,373 B2 | 4/2003 | Bailey |
| 6,543,164 B1 | 4/2003 | Sperl et al. |
| 6,548,967 B1 | 4/2003 | Dowling et al. |
| 6,558,021 B2 | 5/2003 | Wu et al. |
| 6,577,080 B2 | 6/2003 | Lys et al. |
| 6,603,243 B2 | 8/2003 | Parkyn et al. |
| 6,608,453 B2 | 8/2003 | Morgan et al. |
| 6,618,031 B1 | 9/2003 | Bohn, Jr. et al. |
| 6,624,597 B2 | 9/2003 | Dowling et al. |
| 6,639,574 B2 | 10/2003 | Scheibe |
| 6,642,666 B1 | 11/2003 | St-Germain |
| 6,676,284 B1 | 1/2004 | Wynne Willson |
| 6,680,579 B2 | 1/2004 | Allen et al. |
| 6,690,341 B2 | 2/2004 | Tokimoto et al. |
| 6,693,385 B2 | 2/2004 | Koyama |
| 6,704,989 B1 | 3/2004 | Lutz et al. |
| 6,707,389 B2 | 3/2004 | Pederson |
| 6,717,376 B2 | 4/2004 | Lys et al. |
| 6,720,745 B2 | 4/2004 | Mueller et al. |
| 6,774,584 B2 | 8/2004 | Lys et al. |
| 6,777,891 B2 | 8/2004 | Lys et al. |
| 6,781,329 B2 | 8/2004 | Morgan et al. |
| 6,788,011 B2 | 9/2004 | Mueller et al. |
| 6,801,003 B2 | 10/2004 | Schanberger et al. |
| 6,806,659 B1 | 10/2004 | Mueller et al. |
| 6,828,530 B2 | 12/2004 | Boegel et al. |
| 6,869,204 B2 | 3/2005 | Piepgras et al. |
| 6,883,929 B2 | 4/2005 | Dowling |
| 6,888,322 B2 | 5/2005 | Dowling et al. |
| 6,897,624 B2 | 5/2005 | Ducharme et al. |
| 6,928,775 B2 | 8/2005 | Banister |
| 6,936,978 B2 | 8/2005 | Morgan et al. |
| 6,965,205 B2 | 11/2005 | Piepgras et al. |
| 6,967,448 B2 | 11/2005 | Morgan et al. |
| 6,969,954 B2 | 11/2005 | Lys |
| 6,975,079 B2 | 12/2005 | Lys et al. |
| 7,031,920 B2 | 4/2006 | Dowling et al. |
| 7,038,398 B1 | 5/2006 | Lys et al. |
| 7,038,399 B2 | 5/2006 | Lys et al. |
| 7,042,172 B2 | 5/2006 | Dowling et al. |
| 2002/0038157 A1 | 3/2002 | Dowling et al. |
| 2002/0048169 A1 | 4/2002 | Dowling et al. |
| 2002/0070688 A1 | 6/2002 | Dowling et al. |
| 2002/0074559 A1 | 6/2002 | Dowling et al. |
| 2002/0078221 A1 | 6/2002 | Blackwell et al. |
| 2002/0126064 A1 | 9/2002 | Yen |
| 2002/0130627 A1 | 9/2002 | Dowling et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0158583 A1 | 10/2002 | Lys et al. |
| 2002/0176259 A1 | 11/2002 | Ducharme |
| 2003/0011538 A1 | 1/2003 | Lys et al. |
| 2003/0028260 A1 | 2/2003 | Blackwell |
| 2003/0057884 A1 | 3/2003 | Dowling et al. |
| 2003/0057887 A1 | 3/2003 | Dowling et al. |
| 2003/0076281 A1 | 4/2003 | Morgan et al. |
| 2003/0100837 A1 | 5/2003 | Lys et al. |
| 2003/0107887 A1 | 6/2003 | Eberl |
| 2003/0133292 A1 | 7/2003 | Mueller et al. |
| 2003/0222587 A1 | 12/2003 | Dowling et al. |
| 2004/0036066 A1 | 2/2004 | Dowling |
| 2004/0052076 A1 | 3/2004 | Mueller et al. |
| 2004/0066652 A1 | 4/2004 | Hong |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0116039 A1 | 6/2004 | Mueller et al. |
| 2004/0130909 A1 | 7/2004 | Mueller et al. |
| 2004/0178751 A1 | 9/2004 | Mueller et al. |
| 2004/0212320 A1 | 10/2004 | Dowling et al. |
| 2004/0212993 A1 | 10/2004 | Morgan et al. |
| 2005/0099824 A1 | 5/2005 | Dowling et al. |
| 2005/0116667 A1 | 6/2005 | Mueller et al. |
| 2005/0122064 A1 | 6/2005 | Chevalier et al. |
| 2005/0128743 A1 | 6/2005 | Chuey et al. |
| 2005/0151489 A1 | 7/2005 | Lys et al. |
| 2005/0213352 A1 | 9/2005 | Lys |
| 2005/0213353 A1 | 9/2005 | Lys |
| 2005/0218838 A1 | 10/2005 | Lys |
| 2005/0218870 A1 | 10/2005 | Lys |

| | | |
|---|---|---|
| 2005/0219872 A1 | 10/2005 | Lys |
| 2005/0231133 A1 | 10/2005 | Lys |
| 2005/0236029 A1 | 10/2005 | Dowling |
| 2005/0236998 A1 | 10/2005 | Mueller |
| 2005/0253533 A1 | 11/2005 | Lys et al. |
| 2005/0275626 A1 | 12/2005 | Mueller |
| 2005/0276053 A1 | 12/2005 | Nortrup |
| 2006/0002110 A1 | 1/2006 | Dowling |
| 2006/0012987 A9 | 1/2006 | Ducharme |
| 2006/0016960 A1 | 1/2006 | Morgan |
| 2006/0022214 A1 | 2/2006 | Morgan |
| 2006/0050509 A9 | 3/2006 | Dowling |
| 2006/0076908 A1 | 4/2006 | Morgan |

FOREIGN PATENT DOCUMENTS

| | | |
|---|---|---|
| EP | 0507366 | 3/1992 |
| EP | 0629508 | 6/1994 |
| EP | 0876085 | 4/1998 |
| JP | 04-015685 | 1/1992 |
| JP | 6334223 | 12/1994 |
| JP | 7275200 | 10/1995 |
| JP | 9152840 | 6/1997 |
| JP | 9269746 | 10/1997 |
| JP | 1032514 | 11/1998 |
| WO | WO 96/11499 | 4/1996 |
| WO | WO 99/30537 A1 | 6/1999 |
| WO | WO 01/73818 A1 | 10/2001 |

OTHER PUBLICATIONS

Schlig, Eugene S., "Electrothermal Considerations in Display Applications of Light-Emitting Diodes," *IEEE Transactions on Electron Devices*, vol. ED-19, No. 7, Jul. 1982, pp. 847-851.

Asai, S. et al., "Heat Conductive Wire Matrix Board for Light Emitting Diode (LED) Dot Matrix Display," *Circuit World*, vol. 21, No. 4, 1995, pp. 27-31.

"Cree Research, Inc. Announces Fiscal 1994 Results," *PR Newswire*, Jul. 28, 1994, pp. 1-2.

"Cree Research, Inc. Announces Acquistion of Full-Color LED Display Company," *PR Newswire*, Aug. 9, 1994, pp. 1-2.

Mishiko, Yashuhiro, et al., "Large-Scale Color LED Display System," *National Technical Report*, vol. 33, No. 1, Feb. 1987, pp. 94-101.

Miyoshi, Morimasa et al., "Large-Scale Color LED Stock-Information Display Board," *National Technical Report*, vol. 33, No. 1, Feb. 1987, pp. 102-107.

Motozono, Takefumi et al., "LED Display Devices," *National Technical Report*, vol. 28, No. 1, Feb. 1982, pp. 74-82.

Tsujikado, Kazumi et al., "Large-Scale LED Display System," *National Technical Report*, vol. 42, No. 3, Jun. 1996, pp. 18-25.

Shibata, Kazuhisa, "Improvements in Multicolored LEDs May be Practical Display Alternative," *JEE*, Aug. 1985, pp. 60-62.

Murata, Kazuhisa, "Developers Continue to Refine Blue LED Technologies for Display Use," *Display Devices*, 1992, serial No. 6, pp. 46-50.

Koga, Kazuyuki et al., "RGB Multi-Color LED DOT-Matrix Units and Their Application to Large-Size Flat Displays," *Optoelectronics-Devices and Technologies*, vol. 7, No. 2, pp. 221-229, Dec. 1992.

Murata, Kazuhisa, "SiC Brightens Blues for Full-Color LED Display Units," *JEE*, Nov. 1993, pp. 59-65.

Lerner, Eric J., "Laser Diodes and LEDs Light Optoelectronic Devices," *Laser Focus World*, Feb. 1997, pp. 109-117.

Martin, David, et al., "Material Advances Light Full-Color LED Displays," *Laser Focus World*, Mar. 1997, pp. 119-124.

CONFIGURATIONS AND METHODS FOR EMBEDDING ELECTRONICS OR LIGHT EMITTERS IN MANUFACTURED MATERIALS

CROSS-REFERENCES TO RELATED APPLICATIONS

This application claims priority to, and incorporates by reference, the entire disclosure of U.S. Provisional Patent Application No. 60/657,205 filed on Feb. 28, 2005.

FIELD

The present disclosure relates generally to embedding electronics into manufactured materials, and more particularly to configurations and methods for embedding independently controllable lighting units into finish surface materials.

BACKGROUND

Recently, translucent or transparent materials have been introduced for use as finish surface materials, e.g., in countertops, walls, ceilings, floors, fixtures and other surfaces. Transparent or translucent acrylic materials, such as those marketed under the Lucite trademark, are gaining in popularity. Fused glass is also another material that is increasingly being used within surfaces or fixtures. The acrylic or glass materials are known to act as a light guide so that light introduced into one portion of the material (e.g., light coupled into one or more edges of a sheet of finish surface material) is diffused throughout the material to give the material a glow. This feature has led to increased use of such materials in finish surfaces that provide the appearance of being internally lighted.

SUMMARY

Applicants have recognized and appreciated that, rather than merely coupling light into end faces of translucent or transparent surface materials, light sources as well as other electronics may be effectively incorporated in (e.g., embedded in) such materials to provide lighted finish surfaces, as well as finish surfaces having other functionalities in addition to, or as an alternative to, internal lighting of finish surfaces. Applicants also have recognized and appreciated that in embedding one or more light sources into such finish surface materials, issues such as positioning and alignment of the light sources within the material may affect overall aesthetics and quality of the resulting lighted surfaces. For example, in some applications, unless the embedded components are held rigidly in place during manufacture, they may shift position causing misalignments and poor aesthetic and/or functional quality. Also, power needs to be effectively provided to the light sources and, in some cases, data or control signals also need to be provided (e.g., in the case of more sophisticated controllable variable-color light sources).

Thus, there is a need to provide a means to rigidly hold electronic components in place for embedding into manufactured surface materials, both rigid and flexible materials, during the manufacture of the surface materials so as to properly locate the components in the finished material. Also needed are means for interconnecting the embedded components to power systems, control systems, data systems and/or to other embedded components or devices.

In view of the foregoing, disclosed herein are methods and means for embedding electronic components, e.g., light emitting devices, light sensors, heating elements, heat sensors, cooling elements, position sensors, proximity sensors, acoustic sensors, transmitters, electromagnetic receivers and transmitters, and other types and combinations of electronic devices, into molded surface materials, continuously cast surface materials and/or other manufactured or natural surface materials. In one embodiment, the electronic components are embedded during the molding, casting or other manufacturing process used to form the finish surface material. In various aspects, the components can be held in position during manufacture using a scaffold or frame constructed of a sacrificial material, the same material as the finished surface material and/or another material used in the manufacture of the finished product.

In various embodiments, the embedded components can include control circuitry (e.g., printed circuit boards, for separately or controlling each component or collectively controlling multiple components), power conductors and data busses. Conductors and/or busses can be in the form of conductive rails, wire mesh or sheets. Access to the conductors in the finished product can be had by a number of methods, including but not limited to routing, sanding, grinding, drilling into, screwing into, and/or percussively inserting pins into the finished material.

A variety of finish surface materials are contemplated in connection with the concepts disclosed herein, some examples of which include, but are not limited to, the material sold by DuPont under the trademark CORIAN®, as well as other materials marketed under the Lucite trademark (e.g., Lucite® Light Management Solutions, or LLMS).

Thus, one embodiment is directed to a system, comprising a plurality of embedded units, wherein each embedded unit comprising at least one LED-based light source, and at least two conductive elements conductively connected to the plurality of embedded units. The system also comprises a matrix of surface material surrounding the plurality of embedded units and the conductive elements such that the plurality of embedded units are embedded within the surface material, and at least one connection mechanism configured to couple to the conductive elements at least one of power and at least one control signal for the plurality of embedded units.

Another embodiment is directed to a method of embedding components in a surface material, comprising: supporting a plurality of embedded units in a spaced apart relationship from a base configured to at least temporarily support the surface material, each embedded unit comprising at least one LED-based light source; forming a matrix of the surface material about the plurality of embedded units; and providing means to couple at least one of power and data communications to the plurality of embedded units.

Another embodiment is directed to a method of integrating a plurality of embedded units in a continuous cast surface material, comprising: positioning the plurality of embedded units a predetermined distance above a casting bed; and flowing the surface material onto the casting bed to embed the plurality of embedded units therein.

Another embodiment is directed to a method of controlling a plurality of embedded units integrated in a matrix of surface material surrounding the plurality of embedded units, each embedded unit including at least one LED-based light source, the method comprising: independently controlling the at least one LED-based light source in each embedded unit to generate light that is visible from outside the surface material.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like.

In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein.

Additionally, a light source may include as an integral component one or more filters (e.g., color filters), lenses, or other optical components. Also, it should be understood that light sources may be configured for a variety of applications, including, but not limited to, indication, display, and/or illumination. An "illumination source" is a light source that is particularly configured to generate radiation having a sufficient intensity to effectively illuminate an interior or exterior space. In this context, "sufficient intensity" refers to sufficient radiant power in the visible spectrum generated in the space or environment (the unit "lumens" often is employed to represent the total light output from a light source in all directions, in terms of radiant power or "luminous flux") to provide ambient illumination (i.e., light that may be perceived indirectly and that may be, for example, reflected off of one or more of a variety of intervening surfaces before being perceived in whole or in part).

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a FWHM having essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

Lower color temperatures generally indicate white light having a more significant red component or a "warmer feel," while higher color temperatures generally indicate white light having a more significant blue component or a "cooler feel." By way of example, fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

The terms "lighting unit" and "lighting fixture" are used interchangeably herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present disclosure discussed herein. The terms "program" or "computer program" are used herein in a generic sense to refer to any type of computer code (e.g., software or microcode) that can be employed to program one or more processors or controllers.

The term "addressable" is used herein to refer to a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one network implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present disclosure, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

The term "user interface" as used herein refers to an interface between a human user or operator and one or more devices that enables communication between the user and the device(s). Examples of user interfaces that may be employed in various implementations of the present disclosure include, but are not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

The following patents and patent applications are hereby incorporated herein by reference:

U.S. Pat. No. 6,016,038, issued Jan. 18, 2000, entitled "Multicolored LED Lighting Method and Apparatus;"

U.S. Pat. No. 6,211,626, issued Apr. 3, 2001 to Lys et al, entitled "Illumination Components;"

U.S. Pat. No. 6,608,453, issued Aug. 19, 2003, entitled "Methods and Apparatus for Controlling Devices in a Networked Lighting System;"

U.S. Pat. No. 6,548,967, issued Apr. 15, 2003, entitled "Universal Lighting Network Methods and Systems;"

U.S. Pat. No. 6,717,376, issued Apr. 6, 2004, entitled "Methods and Apparatus for Controlling Devices in a Networked Lighting System;"

U.S. Pat. No. 6,965,205, issued Nov. 15, 2005, entitled "Light Emitting Diode Based Products;"

U.S. Pat. No. 6,967,448, issued Nov. 22, 2005, entitled "Methods and Apparatus for Controlling Illumination;"

U.S. Pat. No. 6,975,079, issued Dec. 13, 2005, entitled "Systems and Methods for Controlling Illumination Sources;"

U.S. patent application Ser. No. 09/886,958, filed Jun. 21, 2001, entitled Method and Apparatus for Controlling a Lighting System in Response to an Audio Input;"

U.S. patent application Ser. No. 10/078,221, filed Feb. 19, 2002, entitled "Systems and Methods for Programming Illumination Devices;"

U.S. patent application Ser. No. 09/344,699, filed Jun. 25, 1999, entitled "Method for Software Driven Generation of Multiple Simultaneous High Speed Pulse Width Modulated Signals;"

U.S. patent application Ser. No. 09/805,368, filed Mar. 13, 2001, entitled "Light-Emitting Diode Based Products;"

U.S. patent application Ser. No. 09/716,819, filed Nov. 20, 2000, entitled "Systems and Methods for Generating and Modulating Illumination Conditions;"

U.S. patent application Ser. No. 09/675,419, filed Sep. 29, 2000, entitled "Systems and Methods for Calibrating Light Output by Light-Emitting Diodes;"

U.S. patent application Ser. No. 09/870,418, filed May 30, 2001, entitled "A Method and Apparatus for Authoring and Playing Back Lighting Sequences;"

U.S. patent application Ser. No. 10/045,604, filed Mar. 27, 2003, entitled "Systems and Methods for Digital Entertainment;"

U.S. patent application Ser. No. 09/989,677, filed Nov. 20, 2001, entitled "Information Systems;"

US. patent application Ser. No. 10/163,085, filed Jun. 5, 2002, entitled "Systems and Methods for Controlling Programmable Lighting Systems;"

U.S. patent application Ser. No. 10/245,788, filed Sep. 17, 2002, entitled "Methods and Apparatus for Generating and Modulating White Light Illumination Conditions;"

U.S. patent application Ser. No. 10/325,635, filed Dec. 19, 2002, entitled "Controlled Lighting Methods and Apparatus;"

U.S. patent application Ser. No. 10/360,594, filed Feb. 6, 2003, entitled "Controlled Lighting Methods and Apparatus;"

U.S. patent application Ser. No. 10/435,687, filed May 9, 2003, entitled "Methods and Apparatus for Providing Power to Lighting Devices;"

U.S. patent application Ser. No. 10/828,933, filed Apr. 21, 2004, entitled "Tile Lighting Methods and Systems;"

U.S. patent application Ser. No. 10/839,765, filed May 5, 2004, entitled "Lighting Methods and Systems;"

U.S. patent application Ser. No. 11/010,840, filed Dec. 13, 2004, entitled "Thermal Management Methods and Apparatus for Lighting Devices;"

U.S. patent application Ser. No. 11/079,904, filed Mar. 14, 2005, entitled "LED Power Control Methods and Apparatus;"

U.S. patent application Ser. No. 11/081,020, filed on Mar. 15, 2005, entitled "Methods and Systems for Providing Lighting Systems;"

U.S. patent application Ser. No. 11/178,214, filed Jul. 8, 2005, entitled "LED Package Methods and Systems;"

U.S. patent application Ser. No. 11/225,377, filed Sep. 12, 2005, entitled "Power Control Methods and Apparatus for Variable Loads;" and U.S. patent application Ser. No. 11/224,683, filed Sep. 12, 2005, entitled "Lighting Zone Control Methods and Systems."

It should be appreciated that all combinations of the foregoing concepts and additional concepts discussed in greater detail below are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

DETAILED DESCRIPTION

Figure 1:
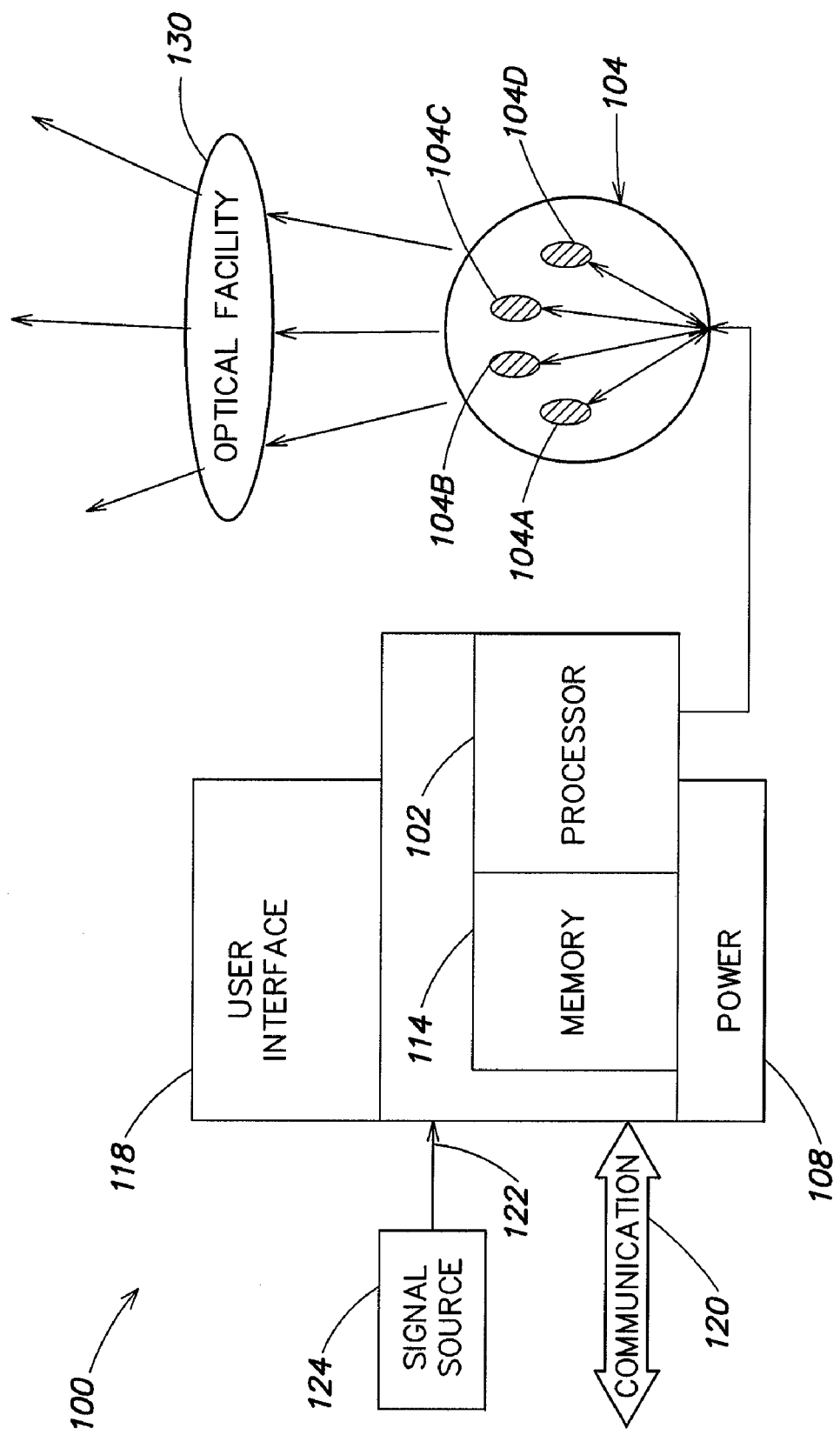
FIG. 1 is a diagram illustrating a lighting unit according to one embodiment of the disclosure.

Various embodiments of the present disclosure are described below, including certain embodiments relating particularly to LED-based light sources. It should be appreciated, however, that the present disclosure is not limited to any particular maimer of implementation, and that the various embodiments discussed explicitly herein are primarily for purposes of illustration. For example, the various concepts discussed herein may be suitably implemented in a variety of environments involving LED-based light sources, other types of light sources not including LEDs, environments that involve both LEDs and other types of light sources in combination, and environments that involve non-lighting-related devices alone or in combination with various types of light sources.

The development of LED-based light sources has led to increased use of lighting in a wide variety of applications. Applicants have recognized and appreciated that one such application is the use of LED-based light sources in translucent or transparent surface materials, e.g., in countertops. While such use of lighting generally may be more cosmetic and aesthetic than functional, lighting may also serve other purposes, including, but not limited to, delineating areas on a surface, indicating temperature, e.g., by having a countertop glow red when heated by a hot object, providing warnings, and/or aiding sanitation as in the use of embedded ultraviolet lighting units for the purpose of killing pathogens on the surface of a counter. For quality and aesthetic purposes, in some exemplary implementations the lighting preferably is accurately held in a fixed position during the manufacturing process used to form the rigid surface, e.g., during molding, extrusion and/or casting of the material. Described herein are methods and means for embedding electronic components, such as LED-based light sources and other components that may be associated therewith, into molded, extruded and/or continuously cast surface materials. Also disclosed are methods and means for accessing the embedded components in the finished product for power and/or data connections.

For illustration, the methods and means are described in relation to embedding LED-based light sources in molded, extruded and/or cast rigid finish surface materials. One example of such a surface material is manufactured by DuPont under the trademark CORIAN®. CORIAN® is a solid surface material generally composed of acrylic polymer and alumina trihydrate. CORIAN® is sometimes referred to as a thermosetting plastic, but can be thermoformed by heating it to 300 F, allowing unique shapes to be created. CORIAN® generally is available in thicknesses of one-quarter, one-half and three-quarters of an inch, with one-half inch thickness being perhaps the most common thickness for many applications. All thicknesses of CORIAN® generally feature the consistancy of color and patterning throughout common to various other known conventional types of solid finish surface materials.

It should be appreciated, however, that the foregoing and following examples according to some embodiments of the present disclosure are primarily for purposes of illustration, and that the disclosure is not limited to any particular example. The methods and means described herein have application for any number of electronic components, including but not limited to LED-based light sources, light sensors, heating elements, heat sensors, cooling elements, position sensors, proximity sensors, acoustic sensors, transmitters, electromagnetic receivers and transmitters and other electronic devices. Further, the described methods and means are applicable to a large variety of rigid and/or flexible surface materials that may be configured as sheets, panels and/or tiles, including but not limited to acrylics, vinyls, materials marketed under the LUCITE trademark, fused glass, epoxy-bonded quartz, and other synthetic and/or natural surface materials for use as countertops, walls, floors, and/or ceilings, and other finish surface materials in which electronic components, including LED-based light sources, may be embedded.

FIG. 1 illustrates one example of a lighting unit 100 having various components including LED-based light sources, all or some of which components may be embedded in a surface material according to various embodiments of the present disclosure. While the form factors for LED-based lighting units may vary significantly, some general examples of various functionality associated with LED-based lighting units similar to those that are described below in connection with FIG. 1 may be found, for example, in U.S. Pat. No. 6,016,038, issued Jan. 18, 2000 to Mueller et al., entitled "Multicolored LED Lighting Method and Apparatus," and U.S. Pat. No. 6,211,626, issued Apr. 3, 2001 to Lys et al, entitled "Illumination Components," which patents are both hereby incorporated herein by reference.

In various embodiments of the present disclosure, the lighting unit 100 shown in FIG. 1 may be used alone or together with other similar lighting units in a system of lighting units (e.g., as discussed further below in connection with FIG. 2). Used alone or in combination with other lighting units, the lighting unit 100 may be employed in a variety of applications in connection with surface materials, including, but not limited to, interior or exterior space (e.g., architectural) lighting in general, direct or indirect illumination of objects or spaces, theatrical or other entertainment-based/special effects lighting, decorative lighting, safety-oriented lighting, vehicular lighting, lighting associated with, or illumination of, displays and/or merchandise (e.g. for advertising and/or in retail/consumer environments), combined lighting and/or illumination and communication systems, etc., as well as for various indication, display and informational purposes.

Additionally, one or more lighting units similar to that described in connection with FIG. 1 may be implemented in a variety of products including, but not limited to, various forms of light modules based on embedded components in surface materials, having various shapes and electrical/mechanical coupling arrangements, as well as a variety of consumer and/or household products (e.g., night lights, toys, games or game components, entertainment components or systems, utensils, appliances, kitchen aids, cleaning products, etc.) and architectural components (e.g., lighted panels for walls, floors, ceilings, lighted trim and ornamentation components, etc.).

In one embodiment, the lighting unit 100 shown in FIG. 1 may include one or more light sources 104A, 104B, 104C, and 104D (shown collectively as 104), wherein one or more of the light sources may be an LED-based light source that includes one or more light emitting diodes (LEDs). In one aspect of this embodiment, any two or more of the light sources may be adapted to generate radiation of different colors (e.g. red, green, blue); in this respect, as discussed above, each of the different color light sources generates a different source spectrum that constitutes a different "channel" of a "multi-channel" lighting unit. Although FIG. 1 shows four light sources 104A, 104B, 104C, and 104D, it should be appreciated that the lighting unit is not limited in this respect, as different numbers and various types of light sources (all LED-based light sources, LED-based and non-LED-based light sources in combination, etc.) adapted to generate radiation of a variety of different colors, including essentially white light, may be employed in the lighting unit 100, as discussed further below.

As shown in FIG. 1, the lighting unit 100 also may include a processor 102 that is configured to output one or more control signals to drive the light sources so as to generate various intensities of light from the light sources. For example, in one implementation, the processor 102 may be configured to output at least one control signal for each light source so as to independently control the intensity of light (e.g., radiant power in lumens) generated by each light source. Some examples of control signals that may be generated by the processor to control the light sources include, but are not limited to, pulse modulated signals, pulse width modulated signals (PWM), pulse amplitude modulated signals (PAM), pulse code modulated signals (PCM) analog control signals (e.g., current control signals, voltage control signals), combinations and/or modulations of the foregoing signals, or other control signals. In one aspect, particularly in connection with LED-based sources, one or more modulation techniques provide for variable control using a fixed current level applied to one or more LEDs, so as to mitigate potential undesirable or unpredictable variations in LED output that may arise if a variable LED drive current were employed. In another aspect, the processor 102 may control other dedicated circuitry (not shown in FIG. 1) which in turn controls the light sources so as to vary their respective intensities.

In general, the intensity (radiant output power) of radiation generated by the one or more light sources is proportional to the average power delivered to the light source(s) over a given time period. Accordingly, one technique for varying the intensity of radiation generated by the one or more light sources involves modulating the power delivered to (i.e., the operating power of) the light source(s). For some types of light sources, including LED-based sources, this may be accomplished effectively using a pulse width modulation (PWM) technique.

In one exemplary implementation of a PWM control technique, for each channel of a lighting unit a fixed predetermined voltage $V_{source}$ is applied periodically across a given light source constituting the channel. The application of the voltage $V_{source}$ may be accomplished via one or more switches, not shown in FIG. 1, controlled by the processor 102. While the voltage $V_{source}$ is applied across the light source, a predetermined fixed current $I_{source}$ (e.g., determined by a current regulator, also not shown in FIG. 1) is allowed to flow through the light source. Again, recall that an LED-based light source may include one or more LEDs, such that the voltage $V_{source}$ may be applied to a group of LEDs constituting the source, and the current $I_{source}$ may be drawn by the group of LEDs. The fixed voltage $V_{source}$ across the light source when energized, and the regulated current $I_{source}$ drawn by the light source when energized, determines the amount of instantaneous operating power $P_{source}$ of the light source ($P_{source}=V_{source}R_{source}$) As mentioned above, for LED-based light sources, using a regulated current mitigates potential undesirable or unpredictable variations in LED output that may arise if a variable LED drive current were employed.

According to the PWM technique, by periodically applying the voltage $V_{source}$ to the light source and varying the time the voltage is applied during a given on-off cycle, the average power delivered to the light source over time (the average operating power) may be modulated. In particular, the processor 102 may be configured to apply the voltage $V_{source}$ to a given light source in a pulsed fashion (e.g., by outputting a control signal that operates one or more switches to apply the voltage to the light source), preferably at a frequency that is greater than that capable of being detected by the human eye (e.g., greater than approximately 100 Hz). In this manner, an observer of the light generated by the light source does not perceive the discrete on-off cycles (commonly referred to as a "flicker effect"), but instead the integrating function of the eye perceives essentially continuous light generation. By adjusting the pulse width (i.e. on-time, or "duty cycle") of on-off cycles of the control signal, the processor varies the average amount of time the light source is energized in any given time period, and hence varies the average operating power of the light source. In this manner, the perceived brightness of the generated light from each channel in turn may be varied.

As discussed in greater detail below, the processor 102 may be configured to control each different light source channel of a multi-channel lighting unit at a predetermined average operating power to provide a corresponding radiant output power for the light generated by each channel. Alternatively, the processor 102 may receive instructions (e.g., "lighting commands") from a variety of origins, such as a user interface 118, a signal source 124, or one or more communication ports 120, that specify prescribed operating powers for one or more channels and, hence, corresponding radiant output powers for the light generated by the respective channels. By varying the prescribed operating powers for one or more channels (e.g., pursuant to different instructions or lighting commands), different perceived colors and brightnesses of light may be generated by the lighting unit.

In one embodiment of the lighting unit 100, as mentioned above, one or more of the light sources 104A, 104B, 104C, and 104D shown in FIG. 1 may include a group of multiple LEDs or other types of light sources (e.g., various parallel and/or serial connections of LEDs or other types of light sources) that are controlled together by the processor 102. Additionally, it should be appreciated that one or more of the light sources may include one or more LEDs that are adapted to generate radiation having any of a variety of spectra (i.e., wavelengths or wavelength bands), including, but not limited to, various visible colors (including essentially white light), various color temperatures of white light, ultraviolet, or infrared. LEDs having a variety of spectral bandwidths (e.g., narrow band, broader band) may be employed in various implementations of the lighting unit 100.

In another aspect of the lighting unit 100 shown in FIG. 1, the lighting unit 100 may be constructed and arranged to produce a wide range of variable color radiation. For example, the lighting unit 100 may be particularly arranged such that the processor-controlled variable intensity (i.e., variable radiant power) light generated by two or more of the light sources combines to produce a mixed colored light (including essentially white light having a variety of color temperatures). In particular, the color (or color temperature) of the mixed colored light may be varied by varying one or more of the respective intensities (output radiant power) of the light sources (e.g., in response to one or more control signals output by the processor 102). Furthermore, the processor 102 may be particularly configured (e.g., programmed) to provide control signals to one or more of the light sources so as to generate a variety of static or time-varying (dynamic) multi-color (or multi-color temperature) lighting effects.

Thus, the lighting unit 100 may include a wide variety of colors of LEDs in various combinations, including two or more of red, green, and blue LEDs to produce a color mix, as well as one or more other LEDs to create varying colors and color temperatures of white light. For example, red, green and blue can be mixed with amber, white, UV, orange, IR or other colors of LEDs. Such combinations of differently colored LEDs in the lighting unit 100 can facilitate accurate reproduction of a host of desirable spectrums of lighting conditions, examples of which include, but are not limited to, a variety of outside daylight equivalents at different times of the day, various interior lighting conditions, lighting conditions to simulate a complex multicolored background, and the like. Other desirable lighting conditions can be created by removing particular pieces of spectrum that may be specifically absorbed, attenuated or reflected in certain environments. Water, for example tends to absorb and attenuate most non-blue and non-green colors of light, so underwater applications may benefit from lighting conditions that are tailored to emphasize or attenuate some spectral elements relative to others.

As shown in FIG. 1, the lighting unit 100 also may include a memory 114 to store various information. For example, the memory 114 may be employed to store one or more lighting commands or programs for execution by the processor 102 (e.g., to generate one or more control signals for the light sources), as well as various types of data useful for generating variable color radiation. The memory 114 also may store one or more particular identifiers (e.g., a serial number, an address, etc.) that may be used either locally or on a system level to identify the lighting unit 100. In various embodiments, such identifiers may be pre-programmed by a manufacturer, for example, and may be either alterable or non-alterable thereafter (e.g., via some type of user interface located on the lighting unit, via one or more data or control signals received by the lighting unit, etc.). Alternatively, such identifiers may be determined at the time of initial use of the lighting unit in the field, and again may be alterable or non-alterable thereafter.

In another aspect, as also shown in FIG. 1, the lighting unit 100 optionally may include one or more user interfaces 118 that are provided to facilitate any of a number of user-selectable settings or functions (e.g., generally controlling the light output of the lighting unit 100, changing and/or selecting various pre-programmed lighting effects to be generated by the lighting unit, changing and/or selecting various parameters of selected lighting effects, setting particular identifiers such as addresses or serial numbers for the lighting unit, etc.). In various embodiments, the communication between the user interface 118 and the lighting unit may be accomplished through wire or cable, or wireless transmission.

Generally speaking, according to various embodiments of the present disclosure, many types of possible user interfaces 118 may not be completely embedded in a surface material, so as to remain accessible. However, it should be appreciated that the disclosure is not limited in this respect, as some types of user interfaces (e.g., based on sensitivity to heat or pressure) may be effectively embedded in the surface material together with other components of the lighting unit and nonetheless provide for control of embedded LED-based light sources from outside the surface material.

In one implementation, the processor 102 of the lighting unit monitors the user interface 118 and controls one or more of the light sources 104A, 104B, 104C and 104D based at least in part on a user's operation of the interface. For example, the processor 102 may be configured to respond to operation of the user interface by originating one or more control signals for controlling one or more of the light sources. Alternatively, the processor 102 may be configured to respond by selecting one or more pre-programmed control signals stored in memory, modifying control signals generated by executing a lighting program, selecting and executing a new lighting program from memory, or otherwise affecting the radiation generated by one or more of the light sources.

In particular, in one implementation, the user interface 118 may constitute one or more switches (e.g., a standard wall switch) that interrupt power to the processor 102. In one aspect of this implementation, the processor 102 is configured to monitor the power as controlled by the user interface, and in turn control one or more of the light sources based at least in part on a duration of a power interruption caused by operation of the user interface. As discussed above, the processor may be particularly configured to respond to a predetermined duration of a power interruption by, for example, selecting one or more pre-programmed control signals stored in memory, modifying control signals generated by executing a lighting program, selecting and executing a new lighting program from memory, or otherwise affecting the radiation generated by one or more of the light sources.

FIG. 1 also illustrates that the lighting unit 100 may be configured to receive one or more signals 122 from one or more other signal sources 124. In one implementation, the processor 102 of the lighting unit may use the signal(s) 122, either alone or in combination with other control signals (e.g., signals generated by executing a lighting program, one or more outputs from a user interface, etc.), so as to control one or more of the light sources 104A, 104B, 104C and 104D in a manner similar to that discussed above in connection with the user interface.

Examples of the signal(s) 122 that may be received and processed by the processor 102 include, but are not limited to, one or more audio signals, video signals, power signals, various types of data signals, signals representing information obtained from a network (e.g., the Internet), signals representing one or more detectable/sensed conditions, signals from lighting units, signals consisting of modulated light, etc. In various implementations, the signal source(s) 124 may be located remotely from the lighting unit 100, or included as a component of the lighting unit. In one embodiment, a signal from one lighting unit 100 could be sent over a network to another lighting unit 100.

Some examples of a signal source 124 that may be employed in, or used in connection with, the lighting unit 100 of FIG. 1 include any of a variety of sensors or transducers that generate one or more signals 122 in response to some stimulus. Examples of such sensors include, but are not limited to, various types of environmental condition sensors, such as thermally sensitive (e.g., temperature, infrared) sensors, humidity sensors, motion sensors, photosensors/light sensors (e.g., photodiodes, sensors that are sensitive to one or more particular spectra of electromagnetic radiation such as spectroradiometers or spectrophotometers, etc.), various types of cameras, sound or vibration sensors or other pressure/force transducers (e.g., microphones, piezoelectric devices), and the like.

Additional examples of a signal source 124 include various metering/detection devices that monitor electrical signals or characteristics (e.g., voltage, current, power, resistance, capacitance, inductance, etc.) or chemical/biological characteristics (e.g., acidity, a presence of one or more particular chemical or biological agents, bacteria, etc.) and provide one or more signals 122 based on measured values of the signals or characteristics. Yet other examples of a signal source 124 include various types of scanners, image recognition systems, voice or other sound recognition systems, artificial intelligence and robotics systems, and the like. A signal source 124 could also be a lighting unit 100, a processor 102, or any one of many available signal generating devices, such as media players, MP3 players, computers, DVD players, CD players, television signal sources, camera signal sources, microphones, speakers, telephones, cellular phones, instant messenger devices, SMS devices, wireless devices, personal organizer devices, and many others.

In one embodiment, the lighting unit 100 shown in FIG. 1 also may include one or more optical elements 130 to optically process the radiation generated by the light sources 104A, 104B, 104C and 104D. For example, one or more optical elements may be configured so as to change one or both of a spatial distribution and a propagation direction of the generated radiation. In particular, one or more optical elements may be configured to change a diffusion angle of the generated radiation. In one aspect of this embodiment, one or more optical elements 130 may be particularly configured to variably change one or both of a spatial distribution and a propagation direction of the generated radiation (e.g., in response to some electrical and/or mechanical stimulus). Examples of optical elements that may be included in the lighting unit 100 include, but are not limited to, reflective materials, refractive materials, translucent materials, filters, lenses, mirrors, and fiber optics. The optical element 130 also may include a phosphorescent material, luminescent material, or other material capable of responding to or interacting with the generated radiation.

As also shown in FIG. 1, the lighting unit 100 may include one or more communication ports 120 to facilitate coupling of the lighting unit 100 to any of a variety of other devices. For example, one or more communication ports 120 may facilitate coupling multiple lighting units together as a networked lighting system, in which at least some of the lighting units are addressable (e.g., have particular identifiers or addresses) and are responsive to particular data transported across the network.

In particular, in a networked lighting system environment, as discussed in greater detail further below (e.g., in connection with FIG. 2), as data is communicated via the network, the processor 102 of each lighting unit coupled to the network may be configured to be responsive to particular data (e.g., lighting control commands) that pertain to it (e.g., in some cases, as dictated by the respective identifiers of the networked lighting units). Once a given processor identifies particular data intended for it, it may read the data and, for example, change the lighting conditions produced by its light sources according to the received data (e.g., by generating appropriate control signals to the light sources). In one aspect, the memory 114 of each lighting unit coupled to the network may be loaded, for example, with a table of lighting control signals that correspond with data the processor 102 receives. Once the processor 102 receives data from the network, the processor may consult the table to select the control signals that correspond to the received data, and control the light sources of the lighting unit accordingly.

In one aspect of this embodiment, the processor 102 of a given lighting unit, whether or not coupled to a network, may be configured to interpret lighting instructions/data that are received in a DMX protocol (as discussed, for example, in U.S. Pat. Nos. 6,016,038 and 6,211,626), which is a lighting command protocol conventionally employed in the lighting industry for some programmable lighting applications. For example, in one aspect, considering for the moment a lighting unit based on red, green and blue LEDs (i.e., an "R-G-B" lighting fixture), a lighting command in DMX protocol may specify each of a red channel command, a green channel command, and a blue channel command as eight-bit data (i.e., a data byte) representing a value from 0 to 255, wherein the maximum value of 255 for any one of the color channels instructs the processor 102 to control the corresponding light source(s) to operate at maximum available power (i.e., 100%) for the channel, thereby generating the maximum available radiant power for that color (such a command structure for an R-G-B lighting unit commonly is referred to as 24-bit color control). Hence, a command of the format [R, G, B]=[255, 255, 255] would cause the lighting unit to generate maximum radiant power for each of red, green and blue light (thereby creating white light).

It should be appreciated, however, that lighting units suitable for purposes of the present disclosure are not limited to a DMX command format, as lighting units according to various embodiments may be configured to be responsive to other types of communication protocols/lighting command formats so as to control their respective light sources. In general, the processor 102 may be configured to respond to lighting commands in a variety of formats that express prescribed operating powers for each different channel of a multi-channel lighting unit according to some scale representing zero to maximum available operating power for each channel.

In one embodiment, the lighting unit 100 of FIG. 1 may include and/or be coupled to one or more power sources 108. In various aspects, examples of power source(s) 108 include, but are not limited to, AC power sources, DC power sources, batteries, solar-based power sources, thermoelectric or mechanical-based power sources and the like. Additionally, in one aspect, the power source(s) 108 may include or be associated with one or more power conversion devices that convert power received by an external power source to a form suitable for operation of the lighting unit 100.

While not shown explicitly in FIG. 1, the lighting unit 100 may be implemented in any one of several different structural configurations according to various embodiments of the present disclosure. Examples of such configurations include, but are not limited to, an essentially linear or curvilinear configuration, a circular configuration, an oval configuration, a rectangular configuration, combinations of the foregoing, various other geometrically shaped configurations, various two or three dimensional configurations, and the like. A given lighting unit also may have any one of a variety of mounting arrangements for the light source(s), enclosure/housing arrangements and shapes to partially or fully enclose the light sources, and/or electrical and mechanical connection configurations.

Additionally, one or more optical elements as discussed above may be partially or fully integrated with an enclosure/housing arrangement for the lighting unit. Furthermore, the various components of the lighting unit discussed above (e.g., processor, memory, power, user interface, etc.), as well as other components that may be associated with the lighting unit in different implementations (e.g., sensors/transducers, other components to facilitate communication to and from the unit, etc.) may be packaged in a variety of ways; for example, in one aspect, any subset or all of the various lighting unit components, as well as other components that may be associated with the lighting unit, may be packaged together and embedded in a surface material. In another aspect, packaged subsets of components may be coupled together electrically and/or mechanically in a variety of manners, and some or all of these packaged subsets may be embedded in the surface material.

In view of the foregoing various possibilities for arranging/packaging different components of a lighting unit, for purposes of the present disclosure, those components of a given lighting unit that are embedded (or to be embedded) in a surface material are referred to hereafter as "an embedded unit" (referred to in the accompanying figures with the reference numeral 100A). According to one embodiment, an embedded unit includes at least one of the LED-based light sources 104A, 104B, 104C, and 104D. For example, in one specific embodiment, an embedded unit may include a group of components packaged together, including three LED-based light sources wherein each light source includes one LED having a color different from the other light sources, and at least one ASIC coupled to the light sources and configured to implement various functionalities associated with at least the processor and the memory discussed above. Of course, it should be appreciated that several other groupings of components are possible according to the present disclosure to constitute an embedded unit. Additionally, as discussed below in connection with FIG. 2, it should be appreciated that multiple embedded units may be embedded in or otherwise integrated with a surface material in a variety of arrangements, and coupled together and operated as an embedded networked lighting system within a surface material.

Figure 2:
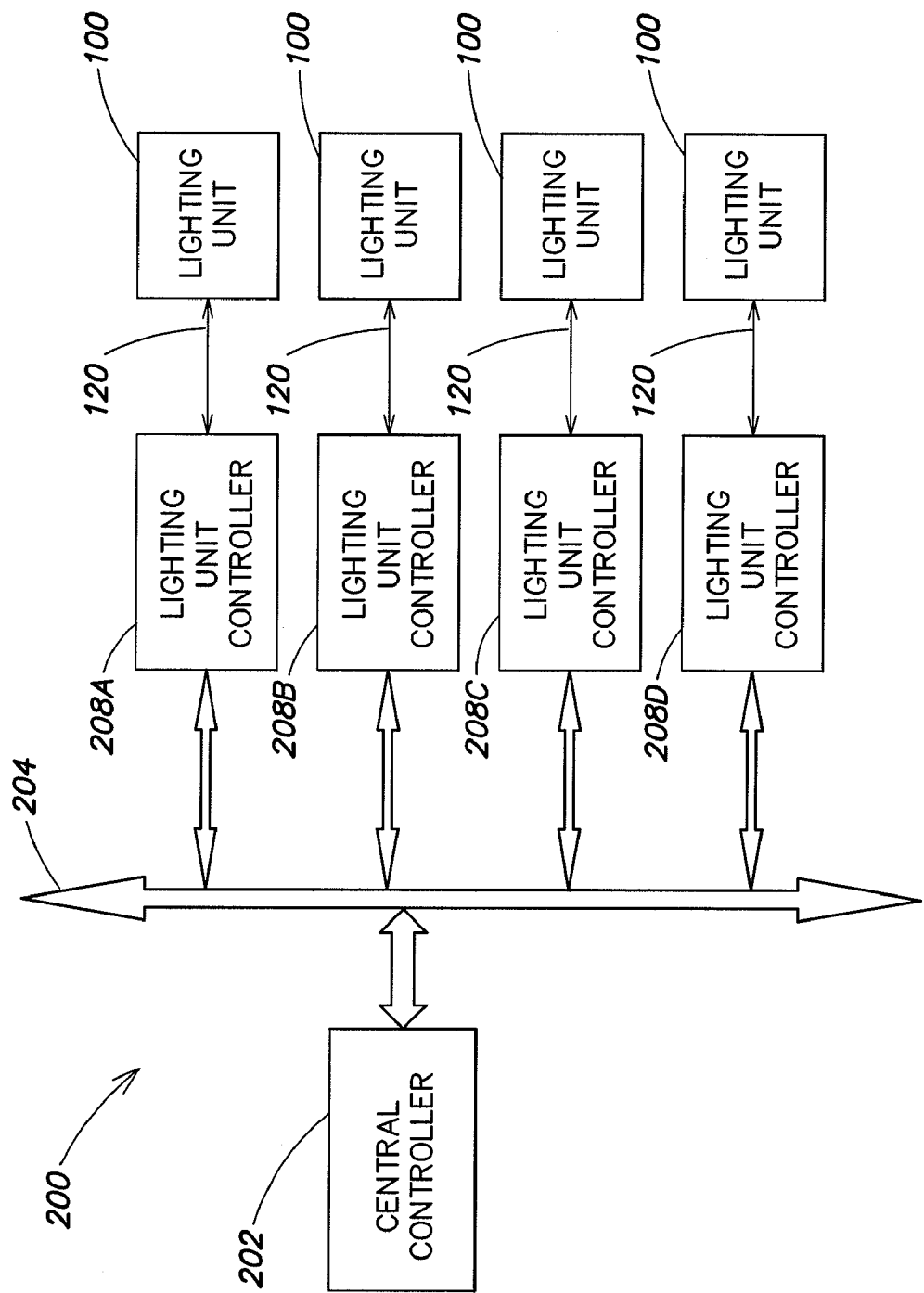
FIG. 2 is a diagram illustrating a networked lighting system according to one embodiment of the disclosure.

FIG. 2 illustrates an example of a networked lighting system 200 according to one embodiment of the present disclosure. In the embodiment of FIG. 2, a number of lighting units 100, similar to those discussed above in connection with FIG. 1, are coupled together to form the networked lighting system. It should be appreciated, however, that the particular configuration and arrangement of lighting units shown in FIG. 2 is primarily conceptual and for purposes of illustration, and that the disclosure is not limited to the particular system topology shown in FIG. 2.

Additionally, while not shown explicitly in FIG. 2, it should be appreciated that the networked lighting system 200 may be configured flexibly to include one or more user interfaces, as well as one or more signal sources such as sensors/transducers. For example, one or more user interfaces and/or one or more signal sources such as sensors/transducers (as discussed above in connection with FIG. 1) may be associated with any one or more of the lighting units of the networked lighting system 200. Alternatively (or in addition to the foregoing), one or more user interfaces and/or one or more signal sources may be implemented as "stand alone" components in the networked lighting system 200. Whether stand alone components or particularly associated with one or more lighting units 100, these devices may be "shared" by the lighting units of the networked lighting system. Stated differently, one or more user interfaces and/or one or more signal sources such as sensors/transducers may constitute "shared resources" in the networked lighting system that may be used in connection with controlling any one or more of the lighting units of the system.

As shown in the embodiment of FIG. 2, the lighting system 200 may include one or more lighting unit controllers (hereinafter "LUCs") 208A, 208B, 208C, and 208D, wherein each LUC is responsible for communicating with and generally controlling one or more lighting units 100 coupled to it. Although FIG. 2 illustrates one lighting unit 100 coupled to each LUC, it should be appreciated that the disclosure is not limited in this respect, as different numbers of lighting units 100 may be coupled to a given LUC in a variety of different configurations (serially connections, parallel connections, combinations of serial and parallel connections, etc.) using a variety of different communication media and protocols.

In the system of FIG. 2, each LUC in turn may be coupled to a central controller 202 that is configured to communicate with one or more LUCs. Although FIG. 2 shows four LUCs coupled to the central controller 202 via a generic connection 204 (which may include any number of a variety of conventional coupling, switching and/or networking devices), it should be appreciated that according to various embodiments, different numbers of LUCs may be coupled to the central controller 202. Additionally, according to various embodiments of the present disclosure, the LUCs and the central controller may be coupled together in a variety of configurations using a variety of different communication media and protocols to form the networked lighting system 200. Moreover, it should be appreciated that the interconnection of LUCs and the central controller, and the interconnection of lighting units to respective LUCs, may be accomplished in different manners (e.g., using different configurations, communication media, and protocols).

For example, according to one embodiment of the present disclosure, the central controller 202 shown in FIG. 2 may by configured to implement Ethernet-based communications with the LUCs, and in turn the LUCs may be configured to implement DMX-based communications with the lighting units 100. In particular, in one aspect of this embodiment, each LUC may be configured as an addressable Ethernet-based controller and accordingly may be identifiable to the central controller 202 via a particular unique address (or a unique group of addresses) using an Ethernet-based protocol. In this manner, the central controller 202 may be configured to support Ethernet communications throughout the network of coupled LUCs, and each LUC may respond to those communications intended for it. In turn, each LUC may communicate lighting control information to one or more lighting units coupled to it, for example, via a DMX protocol, based on the Ethernet communications with the central controller 202.

More specifically, according to one embodiment, the LUCs 208A, 208B, and 208C shown in FIG. 2 may be configured to be "intelligent" in that the central controller 202 may be configured to communicate higher level commands to the LUCs that need to be interpreted by the LUCs before lighting control information can be forwarded to the lighting units 100. For example, a lighting system operator may want to generate a color changing effect that varies colors from lighting unit to lighting unit in such a way as to generate the appearance of a propagating rainbow of colors ("rainbow chase"), given a particular placement of lighting units with respect to one another. In this example, the operator may provide a simple instruction to the central controller 202 to accomplish this, and in turn the central controller may communicate to one or more LUCs using an Ethernet-based protocol high level command to generate a "rainbow chase." The command may contain timing, intensity, hue, saturation or other relevant information, for example. When a given LUC receives such a command, it may then interpret the command and communicate further commands to one or more lighting units using a DMX protocol, in response to which the respective sources of the lighting units are controlled via any of a variety of signaling techniques (e.g., PWM).

It should again be appreciated that the foregoing example of using multiple different communication implementations (e.g., Ethernet/DMX) in a lighting system according to one embodiment of the present disclosure is primarily for purposes of illustration, and that the disclosure is not limited to this particular example.

From the foregoing, it may be appreciated that one or more lighting units as discussed above are capable of generating highly controllable variable color light over a wide range of colors, as well as variable color temperature white light over a wide range of color temperatures. Accordingly, various components of such lighting units, configured as one or more embedded units in a surface material, can provide a wide range of aesthetically pleasing and/or functional lighting in connection with the surface material.

Figure 3:
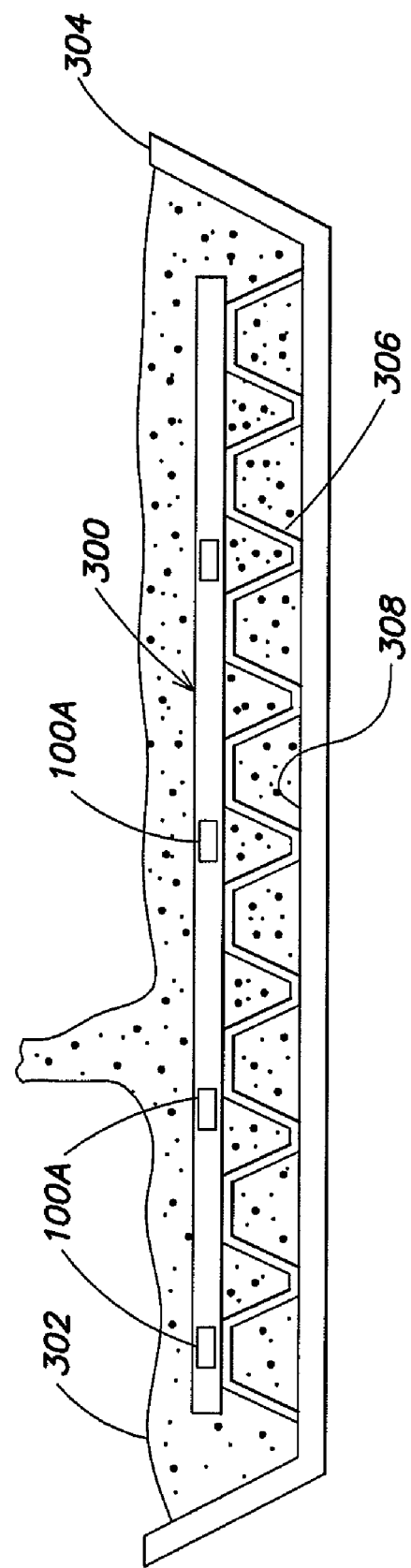
FIG. 3 is a schematic illustration of LED-based light sources being embedded during molding of a surface material according to one embodiment of the disclosure.

As noted previously, when an embedded unit including one or more LED-based light sources is to be integrated with a matrix of surface material, positioning of the embedded unit during the manufacturing of the surface material may be critical. Referring now to FIG. 3, there is shown a schematic illustration of an arrangement 300 of multiple embedded units 100A in a matrix of surface material 302 (i.e., wherein the term "matrix" denotes that the surface material ultimately surrounds the embedded units). The multiple embedded units 100A may be arranged (e.g., positioned, spaced apart) in any of a variety of manners within the arrangement 300. For the embodiment shown in FIG. 3, the surface material may be cast, extruded, and/or molded and arrangement 300 may be positioned within the mold, extrusion and/or casting 304 by means of scaffold or frame 306. Scaffold or frame 306 may be constructed of a sacrificial material, e.g., a low temperature wax, styrofoam, or polymer material. Those of skill in the art will recognize that the use of such sacrificial material for scaffolding or frame 306 is akin to the known "lost wax" casting process for positioning of components within a casting. In one embodiment, scaffolding or frame 306 may be constructed of the same material as surface material 302. During manufacturing, the surface material 302 is poured or flowed into the mold or casting 304. Scaffolding or frame 306 can hold the arrangement 300 of embedded units in the proper position until the surface material 302 begins to set, at which time the scaffold or frame 306 melts or otherwise is absorbed into surface material 302.

Depending on the optical properties of material 302 and the desired optical effect for the completed product, arrangement 300 can include diffusion and/or diffracting layers, lenses, shaped light guides and/or other means for directing light from arrangement 300 to the surface of material 302. For example, arrangement 300 can include a diffusion layer (not shown) to provide a uniformly lighted appearance at viewing surface 308 of material 302. For even white light distribution, a diffusion layer of embedded phosphor or a phosphor suspension in the material may be contemplated. Alternately, a tiled or tessellated effect may be obtained by using lensing (not shown) to concentrate the light beam towards the viewing surface 308, or by simply spacing the arrangement 300 further apart from one another, or by increasing the distance between the arrangement 300 and viewing surface 308. Optionally, shaped light guides (not shown) can provide specific patterns of light at viewing surface 308, including but not limited to lines, circles, and other geometric shapes such as stars, light bursts, etc. In some embodiments, portions of scaffolding or frame 306 can serve to support or be incorporated into the light guiding, shaping and/or directing means.

Figure 4A:
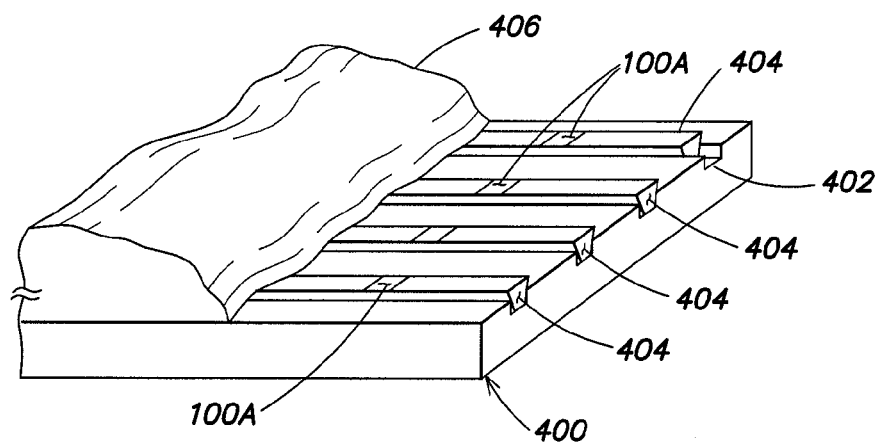
FIG. 4A illustrates embedding LED-based light sources in a surface material product according to one embodiment of the disclosure.

FIG. 4A illustrates an embodiment where a portion or module 400 of the surface material is fabricated with features 402, such as the exemplary channels 402, to accommodate the placement of an arrangement 404 of embedded units 100A. The features 402 may be of any configuration that mates or corresponds with the configuration of the arrangement 300, such that the embedded units 100A of the arrangement 404 maintain their position when placed within features 402. To complete the fabrication of the surface material product, additional material 406 is added to module 400 to embed the arrangement 404 within the finished product. The additional material 406 may or may not be the same material as module 400. Any method of bonding the additional material 406 to the module 400 that provides the desired finished product may be used, including but not limited to using a bonding agent between module 400 and additional material 406, heating the additional material 406 and the module 400 to fuse the additional material 406 with the module 400.

Figure 4B:
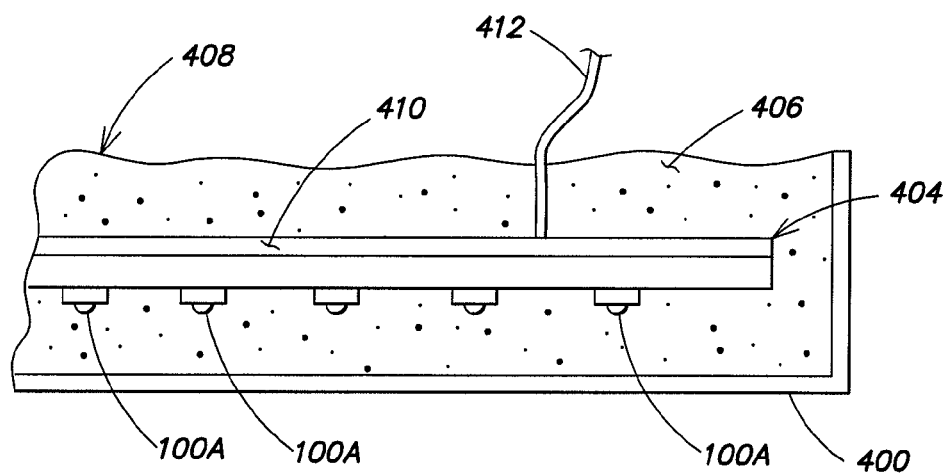
FIG. 4B is a cross-sectional view of LED-based light sources embedded in a surface material according to the embodiment of FIG. 4A.

FIG. 4B is an illustrative cross-sectional view taken through a surface material product 408 with the arrangement 404 of embedded units 100A embedded therein in the manner described with relation to FIG. 4A. Again, it should be appreciated that each of the embedded units 100A need not necessarily include all of the components and features discussed above in connection with FIG. 1; however, generally each embedded unit 100A includes at least one LED-based light source (e.g., see elements 104 in FIG. 1), and may also included some supporting circuitry (e.g., implementing the functionality of the processor and memory discussed above). As shown in FIG. 4B, power and/or data busses 410 can be embedded with arrangement 404, for connection to power and/or control circuitry, as shown by connection 412.

Figure 5A:
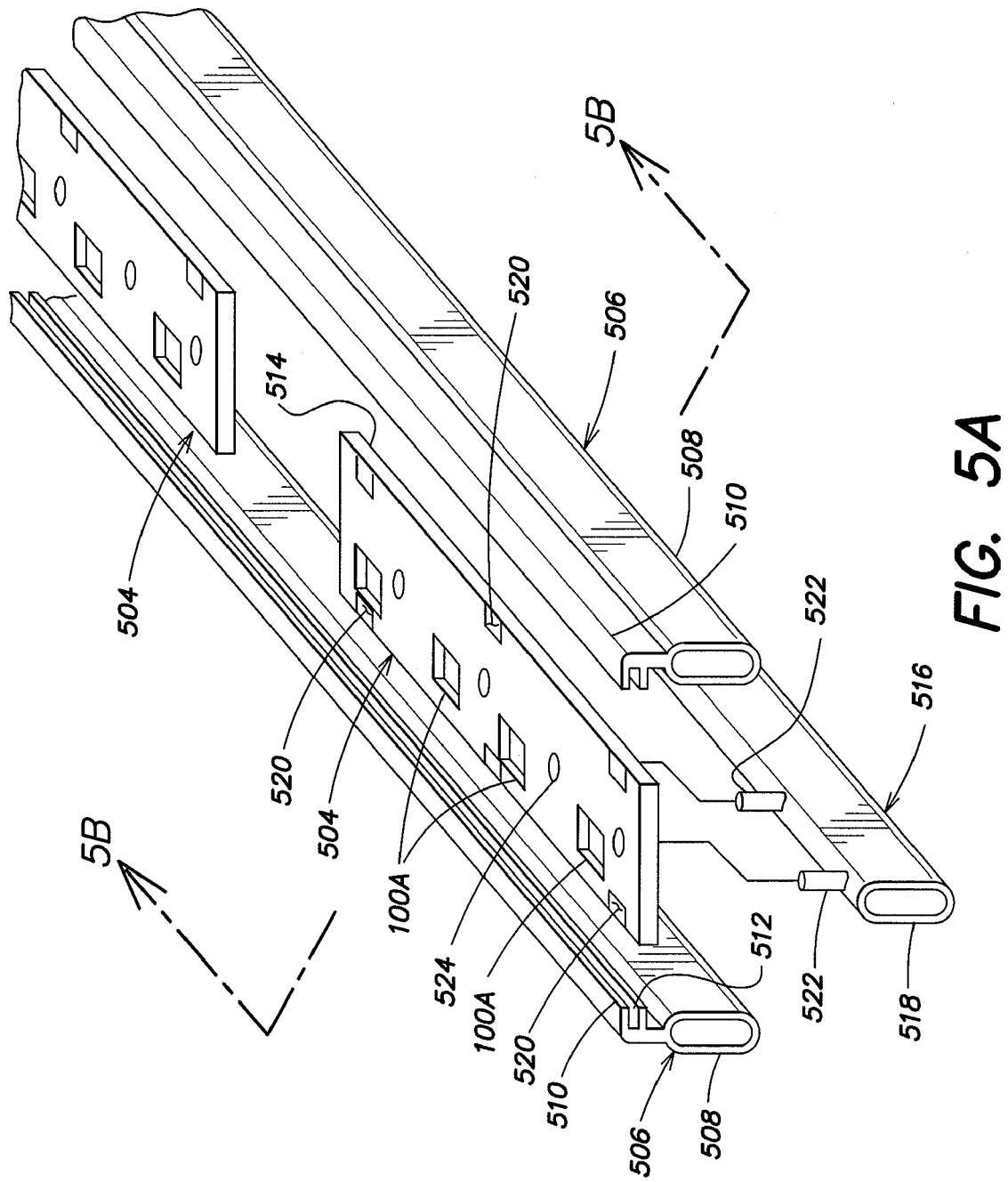
FIG. 5A is an isometric view of a light source array adapted for embedding in a surface material product according to one embodiment of the disclosure.

FIG. 5A illustrates an isometric view of an arrangement 500 of embedded units 100A constituting a light source array adapted for embedding in a surface material product, such as product 408 illustrated in FIG. 4B. As is known in the art, the embedded units 100A can be adapted for placement on printed circuit boards (PCBs) 504, which may include some control circuitry associated with the embedded units (as described with relation to FIGS. 1 and 2). The PCBs 504 may be supported by side rails 506. For reasons that will become apparent with additional description, side rails 506 preferably are fabricated with a hollow base section 508 having a clip section 510 extending therefrom. Clip section 510 has a channel 512 section thereon configured to mate with an edge 514 of PCBs 504. As illustrated in FIG. 5, side rails 506 may be continuous so as to support multiple PCBs 504. Such an arrangement can better maintain the positioning of multiple embedded units within the surface material product, while providing greater flexibility in manufacturing the electronic components and in configuring multiple embedded units within the finished product. Arrangement 500 may include a third conductive rail 516 having a base section 518 configured similar to that of side rails 506.

In addition to providing support for PCBs 504, one or more of the side rails 506 and third rail 516 may serve as conductors for powering the PCBs 504 and embedded units 100A and/or for data communications with the control circuitry of PCBs 504. As such, the rails 506 and 516 are fabricated of a conductive material. For ease of fabrication, rails 506 and 516 may be fabricated of extruded aluminum, in the known manner of aluminum tubing and the like. Rails may also be fabricated of other conductive materials, including but not limited to conductive metals such as copper and silver, conductive polymers and/or other materials and combinations thereof that provide for a conductive path. In some embodiments, the conductive portions of the arrangement 500 may include a conformal coating for isolating the conductive portions of arrangement 500 from surrounding surface material. PCBs 504 may incorporate solder tabs 520 for conductively connecting PCBs 504 with side rails 506. For third rail 516, connection to PCBs 504 can be made through pins 522 extending from base section 518, which mate with pin sockets 524 in PCBs 504.

Figure 5B:
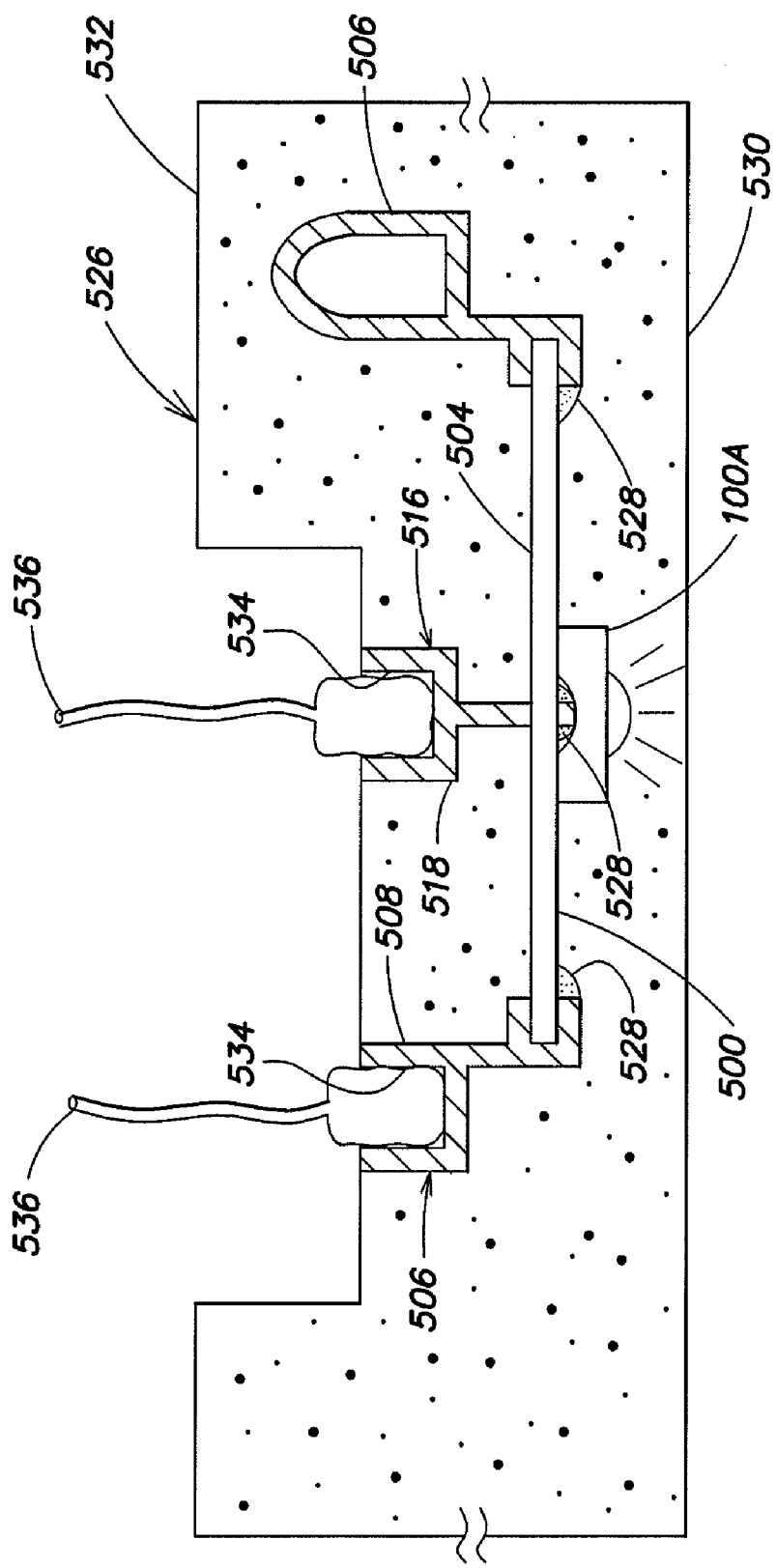
FIG. 5B is a cross-sectional view of a light source array according to the embodiment of FIG. 5A embedded in a material finished product.

FIG. 5B is a cross-sectional view of the finished product 526 taken along a line 5B-5B in FIG. 5A. In the view shown in FIG. 5B, soldering blobs 528 are illustrated to show the connection between rails 506 and 516 to PCBs 504. In one embodiment, arrangement 500 is embedded in finished product 526 such that embedded units 100A are sufficiently near a viewing surface 530 of finished product 526 to provide the desired effect, while bottom surface 532 of finished product 526 generally covers rails 506 and 516. By covering rails 506 and 516, the chance of accidental contact with the conductive surfaces of arrangement 500 may be lessened.

For accessing rails 506 and 516 for power and/or data communications connections, material covering side rails 506 and/or third rail 516 may be removed or otherwise penetrated, including, but not limited to such means as routing, sanding, grinding, drilling, screwing, and/or percussively inserting pins therein. In some embodiments, visible guides may be provided at arrangement 500 and/or in the material of finished product 526 to indicate the locations where connections are to be made. FIG. 5B illustrates removal of a portion of bottom surface 532 to a predetermined depth to expose one side rail 506 and third rail 516. Preferably, the depth removed is such that a portion of the base sections 508, 518 also is removed, thereby providing an opening to within the hollow base sections 508, 518 of rails 506, 516. For the embodiment shown in FIG. 5B, the remaining bottom sections 508, 518 of exposed rails 506, 516 form a u-shaped channel 534, that can accept known u-channel type connectors 536.

While many shapes may be used for base sections 508, 518, including solid cross-sections, the generally hollow or tube-shaped bottom sections 508, 518 shown in FIGS. 5A and 5B may be advantageous. For example, the closed tube prevents material from entering into the hollow within base sections 508, 518 during molding or casting. When exposed by removal of a portion of bottom surface 532 and a portion of base sections 508, 518, there is provided a clean, conductive surface within u-channel 534 for accepting standard u-shaped type connectors 536. It can also be appreciated that power and/or data connections can access the embedded conductive elements from a top surface and/or a side surface of the product 526 (not shown).

Figure 6:
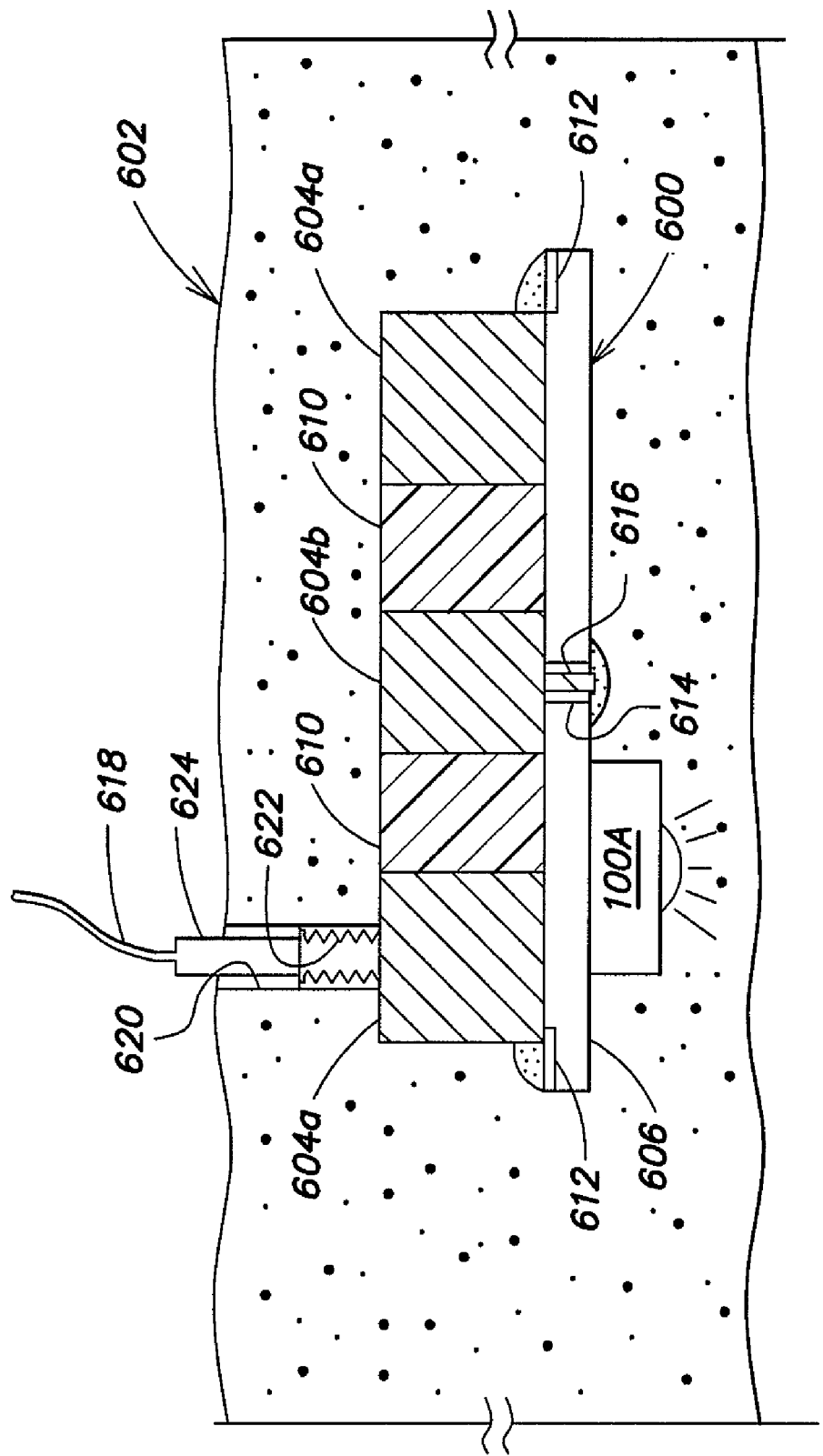
FIG. 6 is a cross-sectional view of a light source array embedded in a material finished product according to one embodiment of the disclosure.

FIG. 6 illustrates a cross-sectional view of an alternative embodiment of an arrangement 600 of embedded units 100A embedded in finished product 602, corresponding generally to the orientation of FIG. 5B. Arrangement 600 includes conductive elements 604a and 604b and PCB 606, which may include control circuitry for embedded units 100A. For the embodiment depicted in FIG. 6, insulating layers 610 are laminated between conductive elements 604a and 604b. The laminated construction of conductive elements 604 and insulating layers 610 may advantageously simplify assembly in that it can be easily bonded to PCB 606. PCB 606 may include a mechanical/electrical connections to conductive elements 604a, 604b. For the embodiment shown in FIG. 6, PCB 606 may include conductive tabs 612 for conductively connecting PCB 606 with outer conductive elements 604a. A bore 614 through PCB 606 may provide a means for conductively connecting PCB 606 with inner conductive element 604b, e.g., by providing access for a soldered electrical connection between PCB 606 and conductive element 604b. Inner conductive element 604b may include pins 616 or the like that mate within bore 614 for improved conductivity between PCB 606 and inner conductive element 604b.

For power and/or data communications connections, means and methods similar to those described in relation to FIGS. 5A and 5b may be employed. For the embodiment shown in FIG. 6, connector 618 is conductively connected to outer conductive element 604a via bore 620. Bore 620 can be blind tapped and/or female threaded insert 622 can be positioned in bore 620 and connector 618 can have a male threaded terminal 624 to mate with tapped bore 620 or insert 622 to provide a solid connection. In one embodiment (not shown), insert 622 can be embedded into product 602 prior to or during the casting, extrusion and/or molding process used for manufacturing product 602. Insert 622 can include a cover to prevent material from entering insert 622 during manufacturing. Bore 620 can then be made into product 602 to pierce through the cover and access insert 622, similar to the access to rails 506, 516 illustrated in FIG. 5B.

Figure 7:
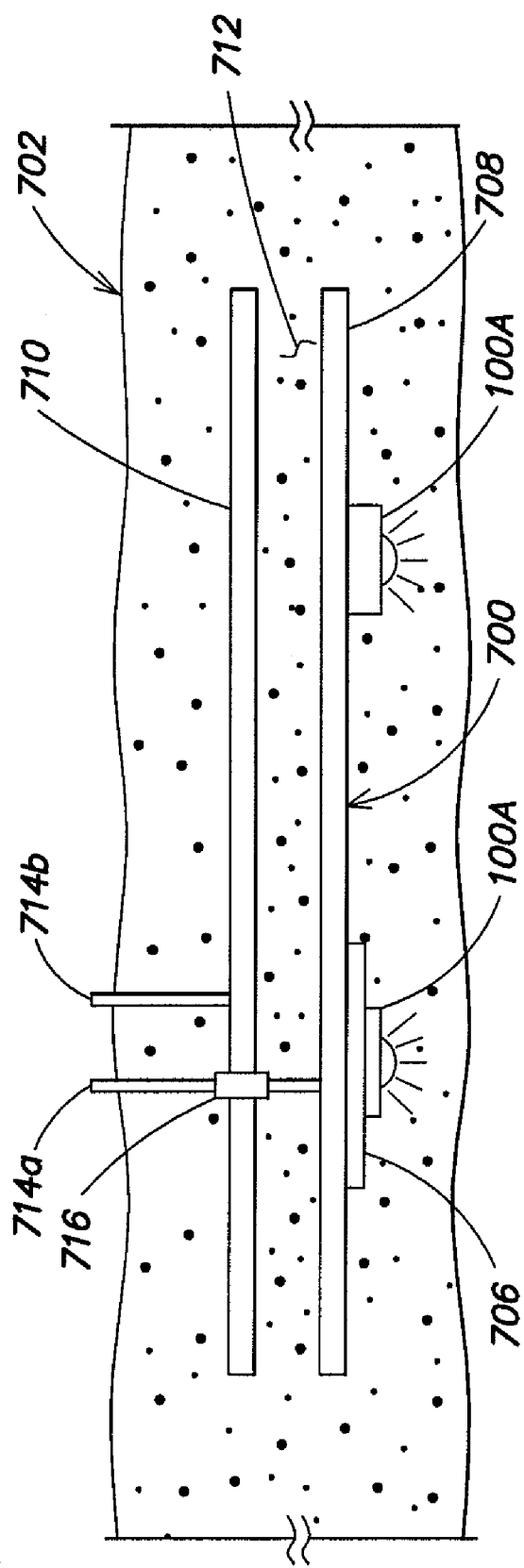
FIG. 7 is a cross-sectional view of a light source array embedded in a material finished product according to one embodiment of the disclosure.

FIG. 7 illustrates a cross-sectional view of a further alternative embodiment of an arrangement 700 of embedded units 100A embedded in finished product 702, also corresponding generally to the orientation of FIG. 5B. Arrangement 700 includes embedded units 100A and optionally PCBs 706 conductively connected to conductive layer 708. Second conductive layer 710 also is embedded in product 702 and spaced apart from array 700 by a layer of surface material 712. Either one or both of conductive layers 708, 710 may be in the form of a conductive sheet and/or a conductive mesh. For power connections to conductive layers 708, 710, means and methods similar to those described in relation to FIGS. 5A, 5B and 6 may be employed. For the embodiment shown in FIG. 7, conductive pins 714a and 714b penetrate product 702 to conductively connect with layers 708 and 710, respectively. To prevent short circuiting between conductive layers 708 and 710, pin 714a can include a non-conductive surface or coating 716 where it penetrates conductive layer 710.

In one embodiment, pins 714a and 714b may be heated prior to penetrating into product 702. When heating is sufficient to cause material 712 to flow, heated pins 714a, 714b may be inserted through material 712 until contact is made with respective conductive layers 708, 710. As heat is removed from pins 714a, 714b, material 712 may again set about pins 714a and 714b. Similarly, when material 712 is susceptible to flow upon application of ultrasonic vibration, pins 714a, 714b may be so vibrated as to penetrate into material 712.

Figure 8:
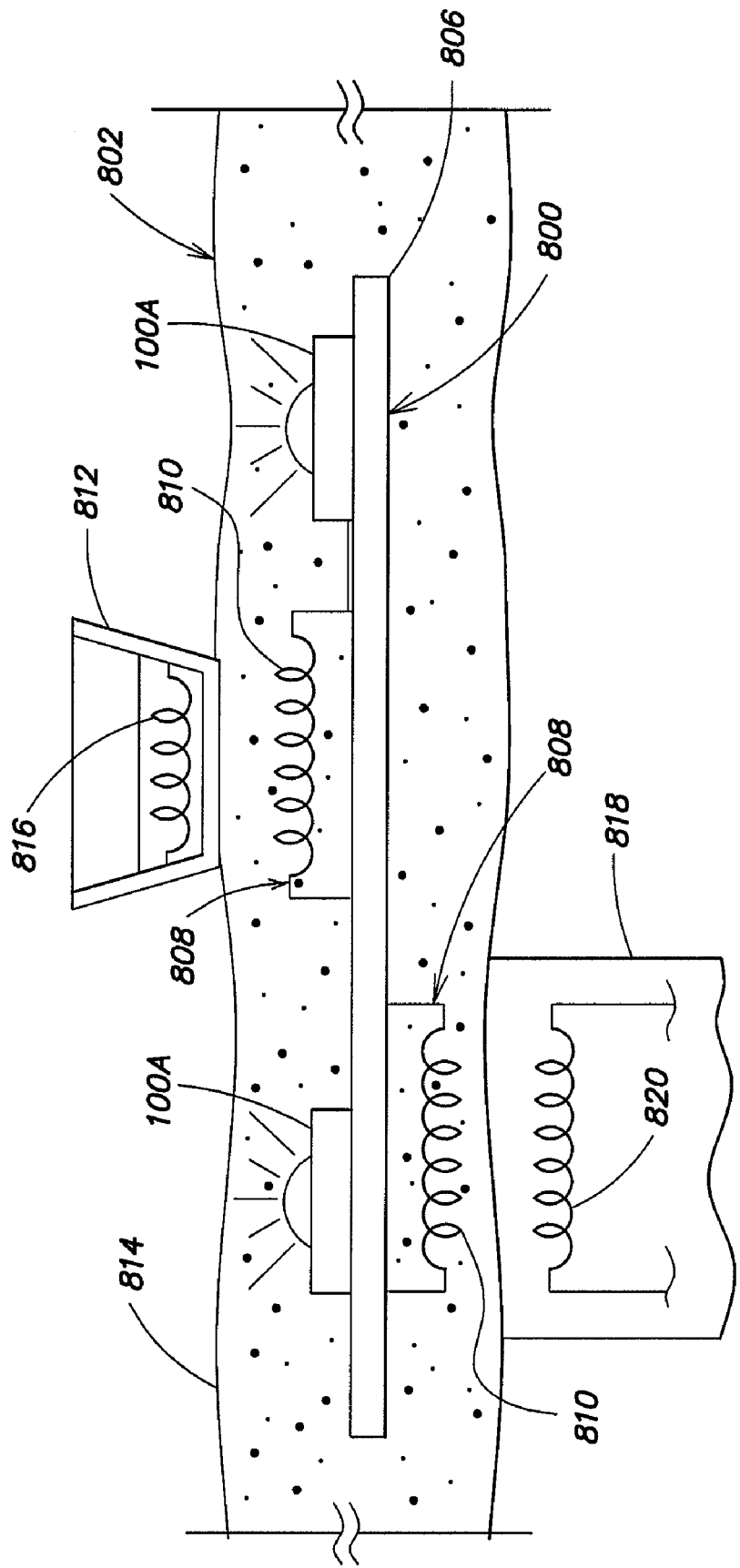
FIG. 8 is an elevational view of a light source array embedded in a material finished product according to one embodiment of the disclosure.

FIG. 8 illustrates an elevational view of an alternative embodiment for providing power and/or data communications to an arrangement 800 embedded in a surface material 802. Arrangement 800 can include embedded units 100A, or other electronic components that may be mounted on PCB 806, which may include some control circuitry for the embedded units 100A, as described with relation to FIGS. 1 and 2. In addition, arrangement 800 can include conductive elements 808 that are formed into inductive loops 810. The inductive loops 810 may be incorporated on PCB 806, or may be physically separate from, yet conductively connected to, PCB 806.

Power and/or data communications may be provided through transformer-like inductive coupling to an external source. For example, surface material 802 may be formed into a countertop and an appliance 812 may be placed on a top surface 814 thereof. The appliance 812 may include inductive coils 816, such that when the appliance 812 is powered and placed on countertop 802 in the vicinity of inductive loops 810, inductive coupling between coils 816 and loops 810 provide power to embedded units 100A to light an area corresponding to the appliance 812. As another example, a power source 818, including inductive coils 820, may be attached to countertop 802 to provide power and/or data communications to inductive loops 810 whenever inductive coils 820 are activated. In addition to inductive coupling, power and/or data communications may be provided through the use of alternating magnetic fields, radio frequency identification (RFID) technology, piezoelectrics and/or other known power or data communications means having no direct physical conductive connection between the source and the electronic components.

Figure 9:
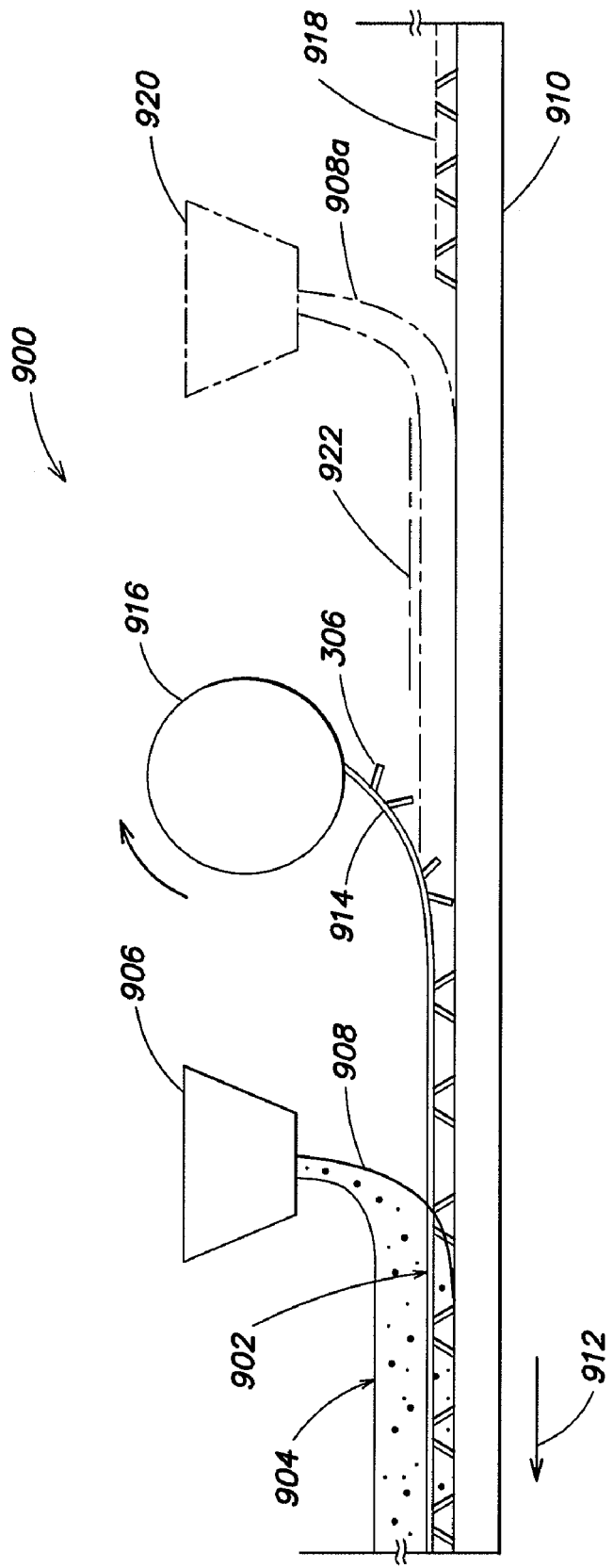
FIG. 9 is a schematic illustration of a manufacturing operation for embedding electronic components in a continuously cast surface material product.

FIG. 9 illustrates one embodiment of a manufacturing operation 900 for integrating an arrangement 902 of embedded units in a continuously cast surface material product 904. In general, hopper 906 contains a quantity of heated material 908 that is flowed from hopper 906 onto continuous casting bed 910 as casting bed 910 moves in the direction shown by arrow 912. The amount of material 908 flowed onto casting bed 910 may be carefully controlled to provide a uniform product 904 as material 908 cools. In one embodiment, the arrangement 902 of embedded units is formed into flexible sheets 914 that can be wound on roller 916. For example, the scaffolding or frame 306 described with relation to FIG. 3 can be configured to support the embedded units while allowing for bending about roller 916. Sheets 914 can be continuously dispensed from roller 916 onto moving casting bed 910. Alternately, less flexible sheets 918 of embedded units can be placed separately onto casting bed 910 (shown dashed in FIG. 9).

In one embodiment, additional heated material 908a can be flowed from a first hopper 920 onto casting bed 910 prior to placing an arrangement 918 of embedded units onto casting bed 910 (shown as dash-dot lines in FIG. 9). Additional material 908a can provide a measure of support for components 922, such that components 922 can be suspended within additional material 908a, when placed onto material 908a (also shown by dash-dot lines in FIG. 9). When material 908 is flowed from hopper 906, material 908a and material 908 can fuse to form a single product 904.

In processes, such as operation 900, where heated materials are used to form the surface material, it will be understood that the electronic components of embedded units can be fabricated such that there are no adverse affects on the operation or performance of the components due to the heat used in manufacturing the surface material. Alternately, or in conjunction with having heat resistant electronic components, the amount of heating in the manufacturing process can be minimized, but adequate for forming the surface material. As an example, the material used for CORIAN® countertops may have a fabrication temperature within a range that would not have an adverse affect on the operation or performance of most electronic components.

Having thus described several illustrative embodiments, it is to be appreciated that various alterations, modifications, and improvements will readily occur to those skilled in the art. As an example, data communications can be implemented using optical connections instead of conductive connections, where a light pipe or other optical path can penetrate the surface material for accessing the embedded electronic components configured to accept such optical data communications. As a further example, multiplexing may be utilized for power and data communications over shared conductive elements, allowing for a reduction in the total number of conductive elements required. Such alterations, modifications, and improvements are intended to be part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The invention claimed is:

1. A system, comprising:
    a plurality of embedded units, each embedded unit comprising at least one LED-based light source;
    at least two conductive elements conductively connected to the plurality of embedded units;
    a matrix of surface material surrounding the plurality of embedded units and the conductive elements such that the plurality of embedded units are embedded within the surface material; the matrix comprising
        a first module serving as a frame for supporting the plurality of embedded units and the conductive elements in a fixed position during fabrication of the matrix and having features thereon for supporting the plurality of embedded units and the conductive elements; and
        a second module bonded to the first module and configured to surround the plurality of embedded units and the conductive elements; and
    at least one connection mechanism configured to couple to the conductive elements at least one of power and at least one control signal for the plurality of embedded units.

2. The system of claim 1, wherein the first module and the second module comprise differing surface materials.

3. The system of claim 1, wherein at least one embedded unit of the plurality of embedded units further comprises control circuitry to facilitate operation of the at least one LED-based light source.

4. The system of claim 3, wherein the at least one embedded unit includes at least one printed circuit board (PCB) on which the control circuitry is disposed.

5. The system of claim 4, wherein at least one of the conductive elements is configured as at least one rail for supporting the at least one PCB.

6. The system of claim 5, wherein the at least one rail comprises a plurality of alternating conductive rails and insulating rails laminated together to form a single laminated structure.

7. The system of claim 5, wherein the at least one connection mechanism comprises a hollow section of the at least one rail, and wherein an interior profile of the hollow section is fabricated to mate with a connector penetrating the matrix of surface material.

8. The system of claim 5, wherein the at least one rail comprises at least two edge rails, each edge rail supporting an edge of the at least one PCB, each edge rail having a channel section, an edge of the at least one PCB mating within the channel section of the edge rail.

9. The system of claim 8, wherein the at least one rail comprises at least one third rail disposed between the at least two edge rails.

10. The system of claim 1, wherein the conductive elements comprise:
    a first layer of conductive material having the plurality of embedded units mounted thereon; and
    a second layer of conductive material spaced apart from said first layer, a portion of said surface material being disposed between the first and second layers.

11. The system of claim 10, wherein the at least one connection mechanism comprises:
    a first conductive pin penetrating the surface material and configured to make a first electrical connection only to the first layer; and
    a second conductive pin penetrating the surface material and configured to make a second electrical connection only to the second layer.

12. The system of claim 11, wherein the first conductive pin penetrates through the second layer, the first conductive pin having a non-conductive surface where it penetrates the second layer.

13. The system of claim 1, wherein the at least one connection mechanism comprises at least one conductive feed contacting the conductive elements at a location where the conductive elements are exposed by removal of a portion of the matrix of surface material.

14. The system of claim 13, wherein the at least one conductive feed comprises an internally threaded insert fixed within a bore in the matrix of surface material for mating with an externally threaded connector.

15. The system of claim 13, wherein the at least one conductive feed comprises an externally threaded connector for mating within a tapped bore in the matrix of surface material.

16. The system of claim 13, wherein the at least one conductive feed comprises a percussive projectile for penetrating into the matrix of surface material.

17. The system of claim 13, wherein the at least one conductive feed comprises a heated pin for penetrating into the matrix of surface material, the heated pin removing a portion of surface material by heating and displacing the portion of surface material.

18. The system of claim 1, wherein the at least one connection mechanism comprises at least one first coil conductively connected to the conductive elements and located within the matrix of surface material, the at least one first coil being configured to facilitate an inductive coupling to a second coil exterior to the matrix of surface material.

19. The system of claim 1, wherein the at least one connection mechanism comprises a radio frequency activated element located within the matrix of surface material and conductively connected to the conductive elements.

20. The system of claim 1, wherein the at least one connection mechanism comprises a piezoelectric element located within the matrix of surface material and conductively connected to the conductive elements.

21. The system of claim 1, wherein the at least one connection mechanism comprises a magnetic field sensitive element located within the matrix of surface material and conductively connected to the conductive elements, the magnetic field sensitive element responding to magnetic field fluctuations exterior to the matrix of surface material.

22. The system of claim 1 wherein the at least one connection mechanism comprises a photo-optical connection for optically coupling at least the at least one control signal for the plurality of embedded units.

23. The system of claim 1, wherein the at least one connection mechanism is configured to couple a multiplexed signal for providing both power and the at least one control signal to the plurality of embedded units, and where each embedded unit is configured to extract the power and the at least one control signal from the multiplexed signal.

24. The system of claim 1, wherein the at least one LED-based light source comprises:
at least one first LED configured to generate first radiation having a first spectrum; and
at least one second LED configured to generate second radiation having a second spectrum different than the first spectrum; and each embedded unit further includes at least one controller configured to independently control a first intensity of the first radiation and a second intensity of the second radiation based at least in part on the at least one control signal.

25. A system, comprising:
a plurality of embedded units, each embedded unit comprising at least one LED-based light source;
at least two conductive elements conductively connected to the plurality of embedded units;
a matrix of surface material surrounding the plurality of embedded units and the conductive elements such that the plurality of embedded units are embedded within the surface material;
at least one connection mechanism configured to couple to the conductive elements at least one of power and at least one control signal for the plurality of embedded units; and
a frame for supporting the plurality of embedded units and the conductive elements in a fixed position during fabrication of the matrix, the frame comprising a sacrificial material absorbed into the matrix during fabrication thereof.

26. The system of claim 25, wherein the at least one LED-based light source comprises:
at least one first LED configured to generate first radiation having a first spectrum; and
at least one second LED configured to generate second radiation having a second spectrum different than the first spectrum; and each embedded unit further includes at least one controller configured to independently control a first intensity of the first radiation and a second intensity of the second radiation based at least in part on the at least one control signal.

27. The system of claim 25, wherein at least one embedded unit of the plurality of embedded units further comprises control circuitry to facilitate operation of the at least one LED-based light source.

28. The system of claim 27, wherein the at least one embedded unit includes at least one printed circuit board (PCB) having the control circuitry disposed thereon, at least one of the conductive elements being configured as at least one rail for supporting the at least one PCB.

29. The system of claim 28, wherein the at least one rail comprises a plurality of alternating conductive rails and insulating rails laminated together to form a single laminated structure.

30. The system of claim 29, wherein the at least one connection mechanism comprises a hollow section of the at least one rail, and wherein an interior profile of the hollow section is fabricated to mate with a connector penetrating the matrix of surface material.

31. The system of claim 29, wherein the at least one rail comprises at least two edge rails, each edge rail supporting an edge of the at least one PCB, each edge rail having a channel section, an edge of the at least one PCB mating within the channel section of the edge rail.

32. The system of claim 25, wherein the conductive elements comprise:
a first layer of conductive material having the plurality of embedded units mounted thereon; and
a second layer of conductive material spaced apart from said first layer, a portion of said surface material being disposed between the first and second layers.

33. The system of claim 32, wherein the at least one connection mechanism comprises:
a first conductive pin penetrating the surface material and configured to make a first electrical connection only to the first layer; and
a second conductive pin penetrating the surface material and configured to make a second electrical connection only to the second layer.

34. The system of claim 25, wherein the at least one connection mechanism comprises at least one conductive feed contacting the conductive elements at a location where the conductive elements are exposed by removal of a portion of the matrix of surface material.

35. The system of claim 34, wherein the at least one conductive feed comprises an internally threaded insert fixed within a bore in the matrix of surface material for mating with an externally threaded connector.

36. The system of claim 34, wherein the at least one conductive feed comprises an externally threaded connector for mating within a tapped bore in the matrix of surface material.

37. The system of claim 34, wherein the at least one conductive feed comprises a percussive projectile for penetrating into the matrix of surface material.

38. The system of claim 34, wherein the at least one conductive feed comprises a heated pin for penetrating into the matrix of surface material, the heated pin removing a portion of surface material by heating and displacing the portion of surface material.

39. The system of claim 25, wherein the at least one connection mechanism comprises at least one first coil conductively connected to the conductive elements and located within the matrix of surface material, the at least one first coil being configured to facilitate an inductive coupling to a second coil exterior to the matrix of surface material.

40. The system of claim 25, wherein the at least one connection mechanism comprises a radio frequency activated element located within the matrix of surface material and conductively connected to the conductive elements.

41. The system of claim 25, wherein the at least one connection mechanism comprises a piezoelectric element located within the matrix of surface material and conductively connected to the conductive elements.

42. The system of claim 25, wherein the at least one connection mechanism comprises a magnetic field sensitive element located within the matrix of surface material and conductively connected to the conductive elements, the magnetic field sensitive element responding to magnetic field fluctuations exterior to the matrix of surface material.

43. The system of claim 25, wherein the at least one connection mechanism comprises a photo-optical connection for optically coupling at least the at least one control signal for the plurality of embedded units.

44. The system of claim 25, wherein the at least one connection mechanism is configured to couple a multiplexed signal for providing both power and the at least one control signal to the plurality of embedded units, and where each embedded unit is configured to extract the power and the at least one control signal from the multiplexed signal.

* * * * *